(12) United States Patent
Hsieh et al.

(10) Patent No.: US 12,200,943 B2
(45) Date of Patent: Jan. 14, 2025

(54) MEMORY DEVICE STRUCTURE AND MANUFACTURING METHOD THEREOF

(71) Applicant: Taiwan Semiconductor Manufacturing Company, Ltd., Hsin-Chu (TW)

(72) Inventors: Wei Ting Hsieh, Hsinchu (TW); Kuen-Yi Chen, Hsinchu (TW); Yi-Hsuan Chen, Taoyuan (TW); Yu-Wei Ting, Taipei (TW); Yi Ching Ong, Hsinchu (TW); Kuo-Ching Huang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/879,432

(22) Filed: Aug. 2, 2022

(65) Prior Publication Data

US 2023/0292526 A1 Sep. 14, 2023

Related U.S. Application Data

(60) Provisional application No. 63/318,889, filed on Mar. 11, 2022.

(51) Int. Cl.
*H01L 29/78* (2006.01)
*H01L 29/51* (2006.01)
(Continued)

(52) U.S. Cl.
CPC ............ *H10B 53/30* (2023.02); *H01L 29/516* (2013.01); *H01L 29/6684* (2013.01); *H01L 29/78391* (2014.09); *H01L 29/94* (2013.01)

(58) Field of Classification Search
CPC ... H10B 53/30; H01L 29/516; H01L 29/6684; H01L 29/78391; H01L 29/94; H01L 28/40; H01L 28/56; H01L 28/75; H01L 28/55
(Continued)

(56) References Cited

U.S. PATENT DOCUMENTS 6,048,738 A * 4/2000 Hsu ........................ H10B 51/30
257/E21.663
6,649,963 B1 * 11/2003 Hsu ................... H01L 29/78391
257/295
(Continued)

FOREIGN PATENT DOCUMENTS

CN 113193047 A 7/2021
JP 2005310881 A 11/2005
(Continued)

OTHER PUBLICATIONS

U.S. Appl. No. 17/199,626, filed Mar. 12, 2021 by inventors Yu-Feng Yin, Tai-Yen Peng, An-Shen Chang, Han-Ting Tsai, Qiang Fu, Chung-Te Lin for "Low-Resistance Contact to Top Electrodes for Memory Cells and Methods for Forming the Same," 53 pages of text, 25 pages of drawings.
(Continued)

*Primary Examiner* — Sheikh Maruf
(74) *Attorney, Agent, or Firm* — HAYNES AND BOONE, LLP

(57) ABSTRACT

A method according to the present disclosure includes forming a bottom electrode layer over a substrate, forming an insulator layer over the bottom electrode layer, depositing a semiconductor layer over the bottom electrode layer, depositing a ferroelectric layer over the semiconductor layer, forming a top electrode layer over the ferroelectric layer, and patterning the bottom electrode layer, the insulator layer, the semiconductor layer, the ferroelectric layer, and the top
(Continued)

electrode layer to form a memory stack. The semiconductor layer includes a plurality of portions with different thicknesses.

20 Claims, 28 Drawing Sheets

(51) Int. Cl.
*H01L 29/66* (2006.01)
*H01L 29/94* (2006.01)
*H10B 53/30* (2023.01)

(58) Field of Classification Search
USPC .......................................................... 257/295
See application file for complete search history.

(56) References Cited

U.S. PATENT DOCUMENTS

| | | | |
|---|---|---|---|
| 8,802,504 B1 | 8/2014 | Hou et al. | |
| 8,803,292 B2 | 8/2014 | Chen et al. | |
| 8,803,316 B2 | 8/2014 | Lin et al. | |
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,496,189 B2 | 11/2016 | Yu et al. | |
| 10,504,835 B1* | 12/2019 | Wang | H01L 24/97 |
| 10,522,749 B2 | 12/2019 | Shen et al. | |
| 2011/0291096 A1* | 12/2011 | Ryoo | H01L 27/127 |
| | | | 438/156 |
| 2016/0336312 A1* | 11/2016 | Yan | H01L 29/40111 |
| 2017/0338207 A1* | 11/2017 | Chen | H01L 21/565 |
| 2018/0240804 A1* | 8/2018 | Yoo | H01L 21/28088 |
| 2018/0358475 A1* | 12/2018 | Guo | H01L 29/78696 |
| 2019/0131420 A1* | 5/2019 | Lu | H01L 29/40111 |
| 2020/0035807 A1* | 1/2020 | Chen | H01L 28/65 |
| 2020/0105738 A1* | 4/2020 | Tseng | H01L 21/705 |
| 2020/0194592 A1* | 6/2020 | Ionescu | G01N 27/4145 |
| 2020/0266282 A1* | 8/2020 | Lu | H01L 29/517 |
| 2020/0321749 A1* | 10/2020 | Gerhard | H01S 5/1017 |
| 2021/0057639 A1* | 2/2021 | Ku | H10N 50/10 |
| 2021/0098685 A1 | 4/2021 | Liou et al. | |
| 2021/0098695 A1 | 4/2021 | Peng et al. | |
| 2021/0159224 A1* | 5/2021 | Shen | H01L 28/75 |
| 2021/0335799 A1* | 10/2021 | Lee | H01L 28/40 |
| 2021/0384315 A1* | 12/2021 | Chen | H01L 29/516 |
| 2022/0320019 A1* | 10/2022 | Chang | H01L 23/145 |
| 2022/0359644 A1* | 11/2022 | Hsiao | H01L 28/87 |
| 2022/0406708 A1* | 12/2022 | Fowler | H01L 23/5225 |

FOREIGN PATENT DOCUMENTS

| | | |
|---|---|---|
| JP | 2014053571 A | 3/2014 |
| TW | 336318 B | 7/1998 |
| TW | 441129 B | 6/2001 |
| TW | 201906075 A | 2/2019 |
| TW | 202133347 A | 9/2021 |
| TW | 202133408 A | 9/2021 |
| WO | 2006091108 A1 | 8/2006 |
| WO | 2007029282 A1 | 3/2007 |

OTHER PUBLICATIONS

U.S. Appl. No. 16/887,244, filed Mar. 29, 2020 by inventors Tai-Yen Peng et al., for "Magnetic Tunnel Junction Device and Method," 42 pages of text, 45 pages of drawings.
U.S. Appl. No. 17/224,309, filed Apr. 7, 2020, by inventors Yu-Feng Yin for "Top Interconnection Metal Lines for a Memory Array Device and Methods for Forming the Same," 57 pages of text, 25 pages of drawings.
U.S. Appl. No. 17/008,000, filed Aug. 31, 2020, by inventors Yu-Feng Yin et al., "Semiconductor Device and Manufacturing Method Thereof," 26 pages of texts, 23 pages of drawings.

* cited by examiner

MEMORY DEVICE STRUCTURE AND MANUFACTURING METHOD THEREOF

PRIORITY DATA

This application claims the benefit of U.S. Provisional Application No. 63/318,889, filed Mar. 11, 2022, which is hereby incorporated by reference in its entirety.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

For example, many modern-day electronic devices contain electronic memory configured to store data, and areal data density in electronic memory is generally limited by the ability to scale dimensions of semiconductor devices. In the semiconductor industry, there is constant demand to increase areal data density of memory devices, either in volatile memory devices or non-volatile memory devices. Volatile memory device generally stores data while powered (i.e., stores data when powered on), while non-volatile memory device can generally store data even when not powered (i.e., stores data when powered on or powered off). Ferroelectric-based memory devices are one promising candidate for next generation non-volatile memory technology because of their excellent electrical properties, such as high speed read/write time, high switching endurance, and/or low power consumption. Although existing ferroelectric-based memory devices have been generally adequate for their intended purposes, they have not been entirely satisfactory in all respects, such as providing high areal data density even when the rate at which individual transistors may be made smaller is slowing.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
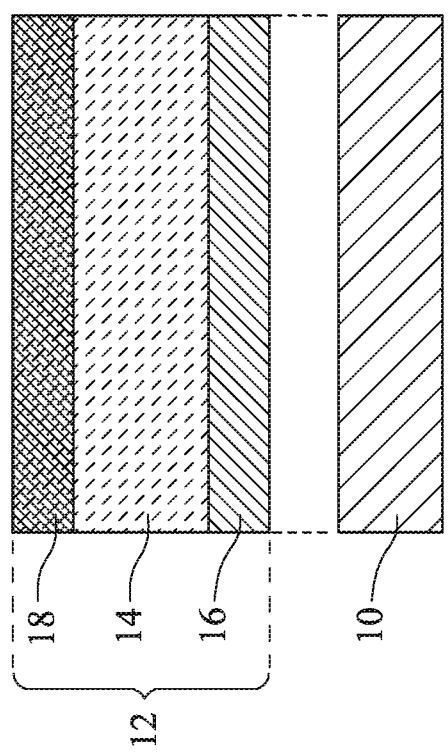
FIGS. 1A, 1B, 1C, 1D, 1E, 1F illustrate fragmentary cross-sectional views of some embodiments of a ferroelectric stack, according to various aspects of the present disclosure.

The present disclosure relates generally to memory devices, and more particularly to, ferroelectric stacks for ferroelectric-based memory devices and methods of fabrication thereof.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.5 nm to 5.5 nm where manufacturing tolerances associated with depositing the material layer are known to be +/−10% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

A ferroelectric-based memory device (or ferroelectric memory device) is a nonvolatile memory (i.e., a memory that can store data in the absence of power). A ferroelectric memory device, such as a ferroelectric field effect transistor (FeFET), a ferroelectric random-access memory (FeRAM or FRAM) device, or a ferroelectric tunnel junction (FTJ) memory device, typically has a ferroelectric stack that includes a ferroelectric switching layer (FSL) stacked between a bottom electrode and a top electrode.

FIG. 1A illustrates a fragmentary cross-sectional view of a ferroelectric stack 12, in portion or entirety, according to various aspects of the present disclosure. The ferroelectric stack 12 is disposed over a substrate 10. The ferroelectric stack 12 includes an FSL stack 14 (i.e., including multiple layers) disposed between a bottom electrode 16 and a top electrode 18. In some embodiments, the bottom electrode 16 and the top electrode 18 are both metal, and the ferroelectric stack 12 is also referred to as a metal-ferroelectric switching layer (FSL)-metal (MFM) stack. The ferroelectric stack 12 can be implemented in a ferroelectric memory device. In some embodiments, the ferroelectric memory device includes a transistor, where ferroelectric stack 12 is integrated to or combined with a metal gate of the transistor. Such configuration can be referred to as a ferroelectric field effect transistor (FeFET)-like memory device. In some embodiments, the FeFET-like memory device has an MFM-MIS structure (i.e., an MFM stack, such as ferroelectric stack 12, is connected to a metal-insulator-semiconductor (MIS) structure (e.g., gate electrode-gate dielectric-semiconductor substrate)), an MFMIS structure (i.e., an MFM stack, such as ferroelectric stack 12, replaces a conventional metal gate of an MIS structure of a transistor (e.g., MFM stack-gate dielectric-semiconductor substrate)), or other suitable FeFET-like memory device structure. In some embodiments, the ferroelectric memory device includes a transistor connected to a capacitor, where ferroelectric stack 12 is implemented as the capacitor, such as in an FeRAM. In some embodiments, the ferroelectric stack 12 provides an FTJ. An FTJ includes a thin ferroelectric layer (measured in nanometers) which allows quantum-mechanical tunneling. The quantum-mechanical tunneling gives rise to tunnel electroresistance with highly discernible ON/OFF resistances.

Figure 2B:
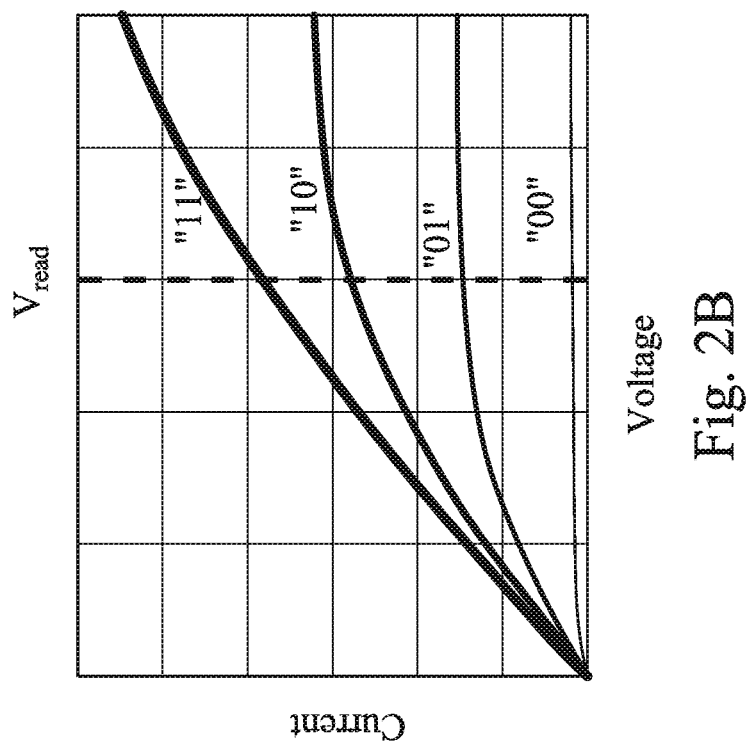
FIGS. 2A and 2B illustrate current-voltage relationship diagrams of a single-level cell (SLC) memory device and a multi-level cell (MLC) memory device, respectively, according to various aspects of the present disclosure.
Figure 2A:
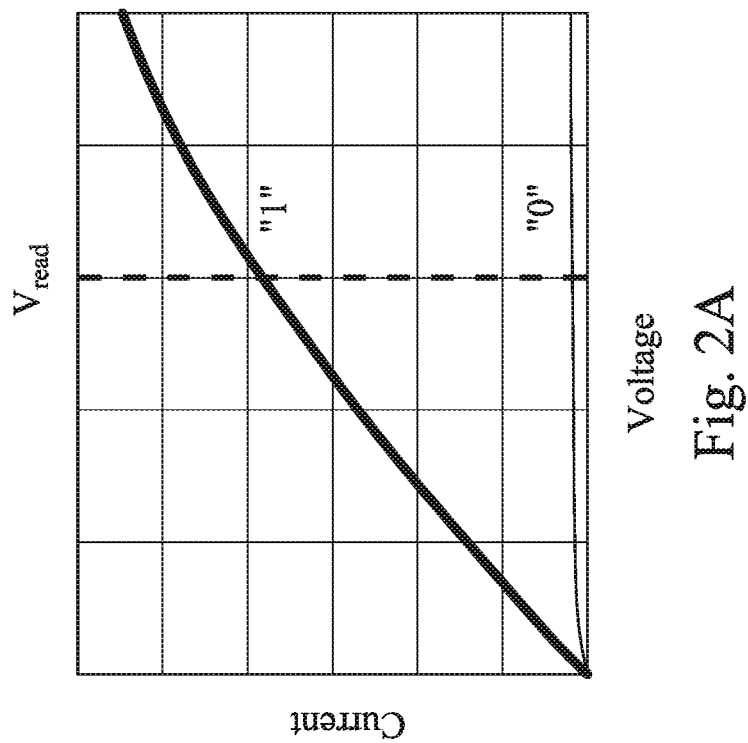

The FSL stack 14 includes at least a layer of ferroelectric material, which generally refers to a material that exhibits polarization upon application of an electric field thereto and continues to exhibit polarization upon removal (or reduction) of the electric field. Accordingly, the ferroelectric material is also known as polarization material. Generally, the ferroelectric material has intrinsic electric dipoles that can be switched between polarization states by the electric field, such as between a first polarization state and a second polarization state. The first polarization state can correspond with a first data state, such as a logical "1" (e.g., a first resistance or a first capacitance depending on the ferroelectric memory device). The second polarization state can correspond with a second data state, such as a logical "0" (e.g., a second resistance or a second capacitance depending on the ferroelectric memory device). A voltage line, a word line, and a bit line can be electrically connected to the ferroelectric memory device to set and/or retrieve a polarization state of the ferroelectric memory device, and thus, write and/or read data from the ferroelectric memory device. To perform a write operation, an electric field can be applied across the ferroelectric memory device to set a polarization state of the FSL stack to the first polarization state or the second polarization state (i.e., store a logical "1" or a logical "0"), for example, by applying voltages, such as a program voltage and/or an erase voltage, to the top electrode and/or the bottom electrode via the word line and/or the voltage line, respectively. To perform a read operation, a resistance or a capacitance of the ferroelectric memory device can be sensed. For example, as illustrated in the current-voltage (I-V) diagram in FIG. 2A, by applying voltages, such as a read voltage (Vread), to the top electrode and/or the bottom electrode via the word line and/or the voltage line, respectively, sensing a resistance on the bit line (for example, by sensing current) to determine whether the FSL stack 14 has the first polarization state or the second polarization state, and thus whether the ferroelectric memory device is storing a logical "1" or a logical "0", corresponding to one bit of data. As each FSL stack 14 stores one bit of data, a ferroelectric memory device associated with the I-V diagram as in FIG. 2A is also referred to as a single-level cell (SLC) memory device.

On the other hand, if the FSL stack 14 can be configured to have more than two resistance values, corresponding to more than one bit of data stored in the memory cell, the ferroelectric memory device is referred to as a multi-level cell (MLC) memory device. An MLC memory device provides higher areal data density than an SLC memory device.

Figure 1B:
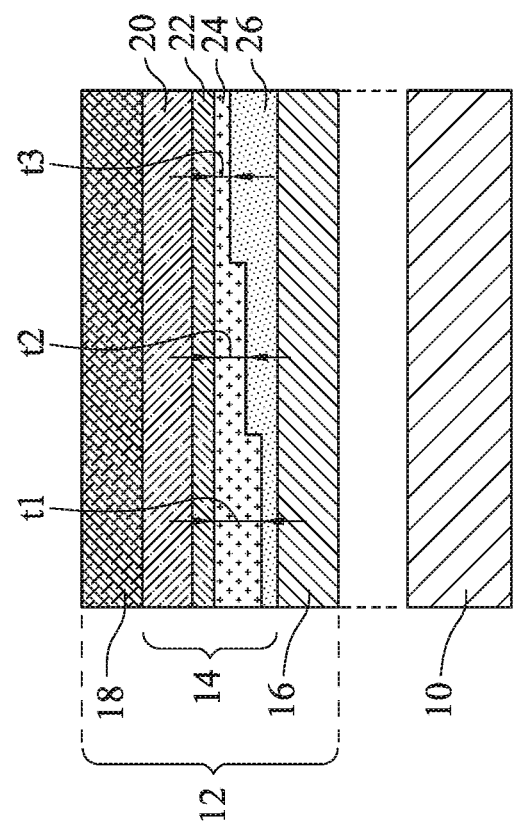

An embodiment of the FSL stack 14 as in FIG. 1A with detail arrangement of multiple layers inside the FSL stack that allows the FSL stack 14 to be configured as an MLC is further illustrated in FIG. 1B. FIG. 1B provides a fragmentary cross-sectional view of the ferroelectric stack 12 that includes the FSL stack 14 as an MLC, in portion or entirety, according to various aspects of the present disclosure.

The ferroelectric stack 12 is disposed over a substrate 10. In some embodiments, ferroelectric stack 12 is disposed directly on the substrate 10, such that the bottom electrode 16 physically contacts the substrate 10. In some embodiments, one or more layers are disposed between the ferroelectric stack 12 and the substrate 10. In some embodiments, the ferroelectric stack 12 is electrically, but not physically, connected to the substrate 10. The bottom electrode 16 physically contacts a bottom surface of the FSL stack 14, and the top electrode 18 physically contacts a top surface of the FSL stack 14, in the depicted embodiment. The bottom electrode 16 may be a metal layer, a metal-nitride layer, a metal-oxide layer, or a semiconductor layer. In one example, the bottom electrode 16 may include Al, Ti, Ta, Au, Pt, W, Ni, Ir, other suitable metal, alloys thereof (e.g., TaN, TiN, and/or other suitable alloy), or combinations thereof. In another example, the bottom electrode 16 may include a metal oxide, such as $IrO_2$. In yet another example, the bottom electrode 16 may include a semiconductor material, such as Si, Ge, SiGe, polysilicon (n-type doped or p-type doped), a III-V compound semiconductor (e.g., including but not limited to InAs, AlAs, GaAs, InP, GaN, InGaAs, InAlAs, GaSb, AlSb, AlP, GaP, or the like), or combinations thereof. The top electrode 18 may be a metal layer, a metal-nitride layer, a metal-oxide layer, or a polysilicon layer. In one example, the top electrode 18 may include Al, Ti, Ta, Au, Pt, W, Ni, Ir, other suitable metal, alloys thereof (e.g., TaN, TiN, and/or other suitable alloy), or combinations thereof. In another example, the top electrode 18 may include a metal oxide, such as $IrO_2$. In yet another example, the top electrode 18 may include polysilicon (n-type doped or p-type doped). In some embodiments, the bottom electrode 16 includes a semiconductor material and the top electrode 18 is a metal layer. In some embodiments, the bottom electrode 16 and the top electrode 18 have the same material composition (e.g., the same metal material). In some embodiments, the bottom electrode 16 has a multi-layer structure, such as a first bottom electrode layer disposed over a second bottom electrode layer, where the first bottom electrode layer and the second bottom electrode layer have different compositions. In some embodiments, the top electrode 18 has a multi-layer structure, such as a first top electrode layer disposed over a second top electrode layer, where the first top electrode layer and the second top electrode layer have different compositions.

The FSL stack 14 includes a ferroelectric layer 20 having a characteristic of ferroelectricity. The ferroelectric layer 20 is also referred to as ferroelectric switching layer (FSL). The ferroelectric layer 20 includes a ferroelectric material (polarization material). The ferroelectric layer 20 may be a single layer or a multi-layer structure, such as a first ferroelectric layer disposed over a second ferroelectric layer, wherein the first ferroelectric layer and the second ferroelectric layer have different compositions. The ferroelectric material can be a high-k dielectric material, such as a dielectric material having a dielectric constant (k) greater than about 28 (e.g., k≥28), having an orthorhombic crystal structure. In some embodiments, the ferroelectric layer 20 includes a metal oxide material, a metal oxynitride material, or an element doped metal oxide. For example, the ferroelectric layer 20 may include a hafnium oxide-based material or a zirconium oxide-based material. In furtherance of the example, the ferroelectric layer 20 can include hafnium oxide (e.g., $Hf_xO_y$), hafnium zirconium oxide (e.g., $Hf_xZr_zO_y$) (also referred to as HZO), hafnium aluminum oxide (e.g., $Hf_x$-$Al_zO_y$), hafnium lanthanum oxide (e.g., $Hf_xLa_zO_y$), hafnium cerium oxide (e.g., $Hf_xCe_zO_y$), hafnium silicon oxide ($Hf_x$-$SiO_y$), hafnium gadolinium oxide (e.g., $Hf_xGd_zO_y$), other suitable $Hf_xO_y$-based material (e.g., $Hf_xSr_zO_z$, $Hf_xY_yO_z$), or combinations thereof, where x, y, z are atom percentages. In another example, the ferroelectric layer 20 can include a $Zr_jO_k$-based material, where j, k, z are atom percentages. In some embodiments, a thickness of the ferroelectric layer 20 is less than about 10 nm. If the thickness of the ferroelectric layer 20 is larger than about 10 nm, the read current may become too small to be sensed, and/or differences between logical states may become too small to be discerned.

The FSL stack 14 further includes a dielectric layer 22 under the ferroelectric layer 20. The dielectric layer 22 includes a non-polarization material. In some embodiments, the dielectric layer 22 includes a dielectric material having a dielectric constant (k) smaller than about 28 (e.g., k<28). The value of the dielectric constant is not trivial. One function of the dielectric layer 22 is to create different resistance and thus different read currents corresponding to different polarization orientations of the ferroelectric layer 20. If the dielectric constant is larger than about 28, the read current may become too small to detect. The dielectric material can include a material having different crystalline characteristics and/or different crystalline conditions than a material of ferroelectric layer 20. For example, where ferroelectric layer 20 includes a dielectric material having a crystalline structure, the dielectric layer 22 incudes a dielectric material having an amorphous structure (e.g., dielectric material in non-crystalline form (i.e., having a disordered atomic structure)). The dielectric layer 22 has an amorphous structure to inhibit any additional crystalline growth and/or grain growth in the ferroelectric layer 20 that can lead to crystal phase changes that cause undesired ferroelectric changes in the ferroelectric layer 20. In some embodiments, the dielectric layer 22 includes a metal oxide material that is different than a metal oxide material of the ferroelectric layer 20. For example, the dielectric layer 22 includes $Al_xO_y$, $Si_xO_y$, $Ta_xO_y$, $Ti_xO_y$, $La_xO_y$, $Y_xO_y$, $Sr_xTiO_z$, or combinations thereof, where x, y, z are atom percentages. In one example, the dielectric layer 22 includes $Si_xN_y$. A thickness of the dielectric layer 22 may be less than about 2 nm. The thickness is not trivial. If the thickness of the dielectric layer 22 is larger than about 2 nm, the read current may become too small to be sensed, and/or differences between logical states may become too small to be discerned.

The FSL stack 14 further includes an insulator layer 26 and a semiconductor layer 24 stacked between the insulator layer 26 and the dielectric layer 22. The insulator layer 26 includes a dielectric material having a dielectric constant (k) smaller than about 9 (e.g., k<9). The dielectric constant is not trivial. If the dielectric constant is larger than about 9, the read current may become too small to detect. In some embodiments, the insulator layer 26 includes a metal oxide material that is different than a metal oxide material of the ferroelectric layer 20. For example, the insulator layer 26 includes $Al_xO_y$, $Si_xO_y$, $Ta_xO_y$, $Ti_xO_y$, $La_xO_y$, $Y_xO_y$, $Sr_xTiO_z$, or combinations thereof, where x, y, z are atom percentages. In furtherance of the embodiments, the insulator layer 26 may include the same material compositions with the dielectric layer 22 (e.g., same metal oxide). Alternatively, the insulator layer 26 may include different material compositions from the dielectric layer 22. For example, the dielectric layer 22 may include a metal oxide with dielectric constant from about 9 to about 28, and the insulator layer 26 may include another metal oxide with dielectric constant less than about 9.

Still referring to FIG. 1B, the insulator layer 26 does not have a uniform thickness, but several discrete thicknesses instead. In the depicted embodiment, the insulator layer 26 have three portions with three different thicknesses. From one edge to another edge of the insulator layer 26, the thickness of the insulator layer 26 increases in steps, resulting in a top surface of the insulator layer 26 having a step-profile. Correspondingly, the semiconductor layer 24, as a layer stacked between the insulator layer 26 and the dielectric layer 22, also has three portions with three different thicknesses, denoted as t1, t2, and t3 with t1>t2>t3. The semiconductor layer 24 includes a semiconductor material, such as Si, Ge, SiGe, polysilicon (n-type doped or p-type doped), a III-V compound semiconductor (e.g., including but not limited to InAs, AlAs, GaAs, InP, GaN, InGaAs, InAlAs, GaSb, AlSb, AlP, GaP, or the like), or combinations thereof. One function of the semiconductor layer 24 is to create depletion region(s) under the dielectric layer 22. The different thicknesses of the semiconductor layer 24 results in multiple depletion regions with different heights. In other words, multiple depletion region thicknesses, and thus multiple tunnel barrier thicknesses (and accordingly different tunnel lengths), in multiple portions of the FSL stack 14 are created. As the depletion region creates barriers for electrons to tunnel through, the thicknesses t1, t2, t3 are also referred to as barrier thicknesses (or barrier widths) t1, t2, t3. Each of the barrier widths t1, t2, t3 may be not larger than about 10 nm, such as from about 1 nm to about 10 nm. In some embodiments, the difference between barrier widths t1 and t2 (e.g., t1-t2) ranges from about 1 nm to about 10 nm, and the difference between barrier widths t2 and t3 (e.g., t2-t3) ranges from about 1 nm to about 10 nm. The thicknesses and the differences between the thicknesses are not trivial. If the barrier width is larger than about 10 nm, the depletion region may become too wide for electrons to tunnel through and read current may become too small to detect. If the differences between two adjacent barrier widths are larger than about 10 nm, the read current may become too small to be detect. If the differences between two adjacent barrier widths are smaller than about 1 nm, the difference among reading currents may become too small to discern.

The multiple depletion region thicknesses (i.e., multiple barrier widths) in one FSL stack 14 make it possible to provide multiple data states, as multiple tunnel lengths result in multiple resistance levels of an FSL stack. To perform a write operation, different electric field strengths can be applied across the ferroelectric memory device to set one of multiple polarization states for the FSL stack, for example, by applying voltages, such as a program voltage and/or an erase voltage, to the top electrode and/or the bottom electrode via the word line and/or the voltage line, respectively. In the depicted embodiment, three tunnel lengths provides four possible polarization states, namely a first polarization state (i.e., store a logical "00"), a second polarization state (i.e., store a logical "01"), a third polarization state (i.e., store a logical "10"), and a fourth polarization state (i.e., store a logical "11"). To perform a read operation, a resistance or a capacitance of the ferroelectric memory device can be sensed. For example, referring to FIG. 2B for the depicted current-voltage (I-V) diagram, by applying voltages, such as a read voltage (Vread), to the top electrode and/or the bottom electrode via the word line and/or the voltage line, respectively, sensing a resistance on the bit line (for example, by sensing current) to determine whether the FSL stack 14 has one of the first to fourth polarization states, and thus whether the ferroelectric memory device is storing a logical "00", a logical "01", a logical "10", or a logical "11", which corresponds to two bits of data. As each FSL stack 14 stores more than one bit of data, the ferroelectric memory device associated with the example I-V diagram as in FIG. 2B is also referred to as a multiple-level cell (MLC) memory device.

Figure 1C:
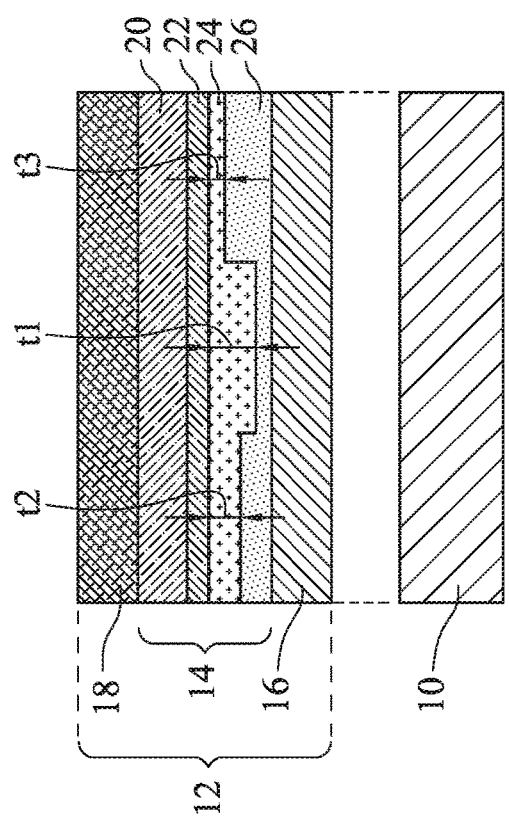
Figure 1D:
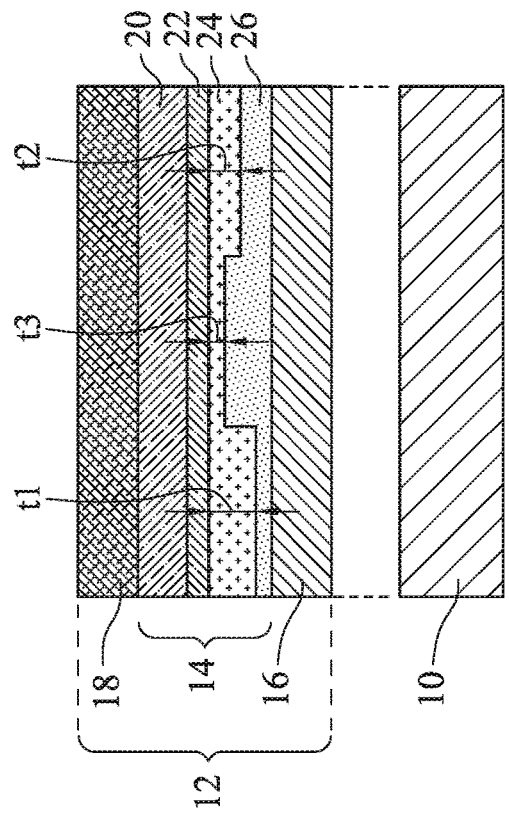
Figure 1E:
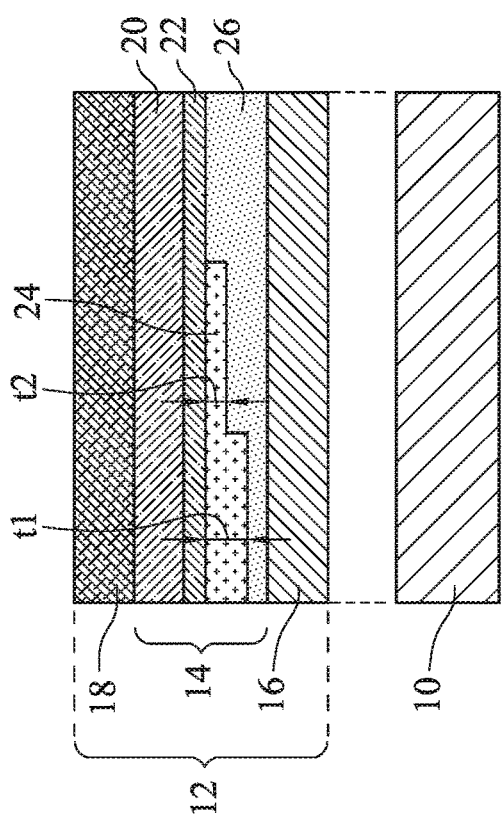
Figure 1F:
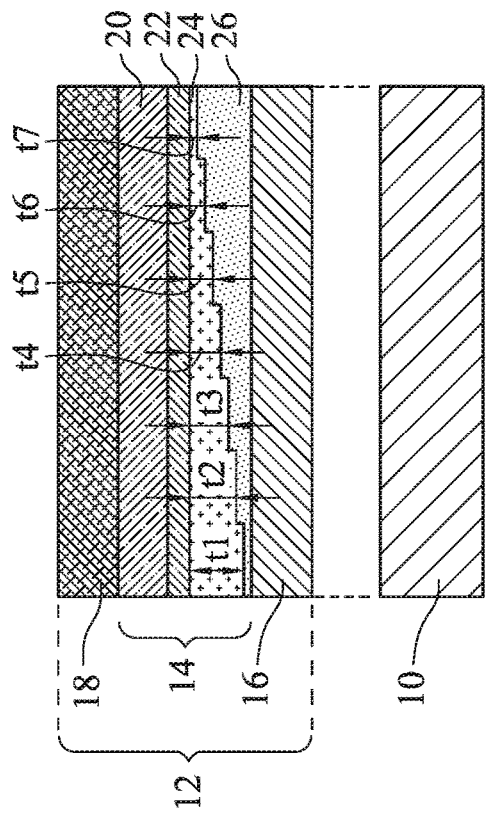

FIGS. 1C-1F illustrate alternative embodiments of detail arrangements of multiple layers inside the FSL stack 14 that allows the FSL stack 14 to be configured as an MLC. Referring to FIGS. 1C and 1D, the step-profiles of the insulator layer 26 and the semiconductor layer 24 do not have to be monotonous. In FIG. 1C, the portion of the largest thickness t1 of the semiconductor layer 24 is positioned in the middle. In FIG. 1D, the portion of the smallest thickness t3 of the semiconductor layer 24 is positioned in the middle. Referring to FIG. 1E, the smallest thickness t3 of the semiconductor layer 24 can even be zero (e.g., t3=0), such that the portion of the insulator layer 26 having the largest thickness is in contact with the bottom surface of the dielectric layer 22. Referring to FIG. 1F, the insulator layer 26 and the semiconductor layer 24 may have more than three different thicknesses, such as seven thicknesses t1 to t7 in the depicted embodiment. A FSL stack 14 in FIG. 1F may support eight logical states, which corresponds to three bits of data in one FSL stack and achieves an even higher areal data density.

Figure 3:
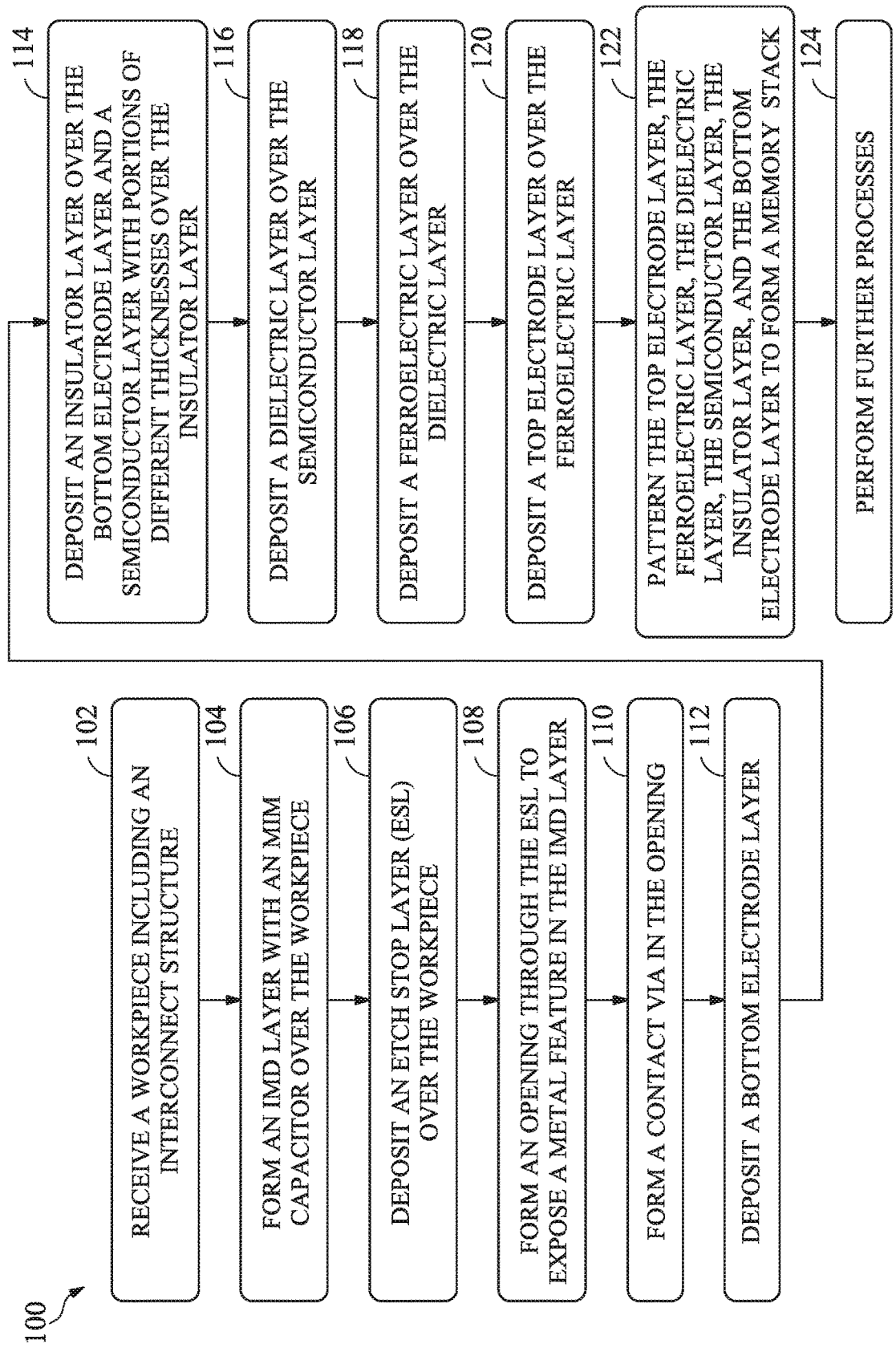
FIG. 3 is a flow chart illustrating an example method of forming a memory device structure, according to various aspects of the present disclosure.

Reference is now made to FIG. 3. Illustrated in FIG. 3 is a method 100 of forming a ferroelectric memory device from a workpiece 200, according to various aspects of the present disclosure. The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method. The method 100 is described below in conjunction with FIGS. 4-18, which are fragmentary cross-sectional views of the workpiece 200 at different stages of fabrication according to various embodiments of the method 100. Because the workpiece 200 will be fabricated into a device structure, the workpiece 200 may be referred to herein as a device 200 as the context requires. For avoidance of doubts, the X, Y and Z directions in the figures are perpendicular to one another. Throughout the present disclosure, unless expressly otherwise described, like reference numerals denote like features.

The device 200 shown in the figures of the present disclosure is simplified and not all features in the device 200 are illustrated or described in detail. The device 200 shown in the figures may be a portion of an IC chip, a system on chip (SoC), or portion thereof, that may include various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof.

Figure 4:
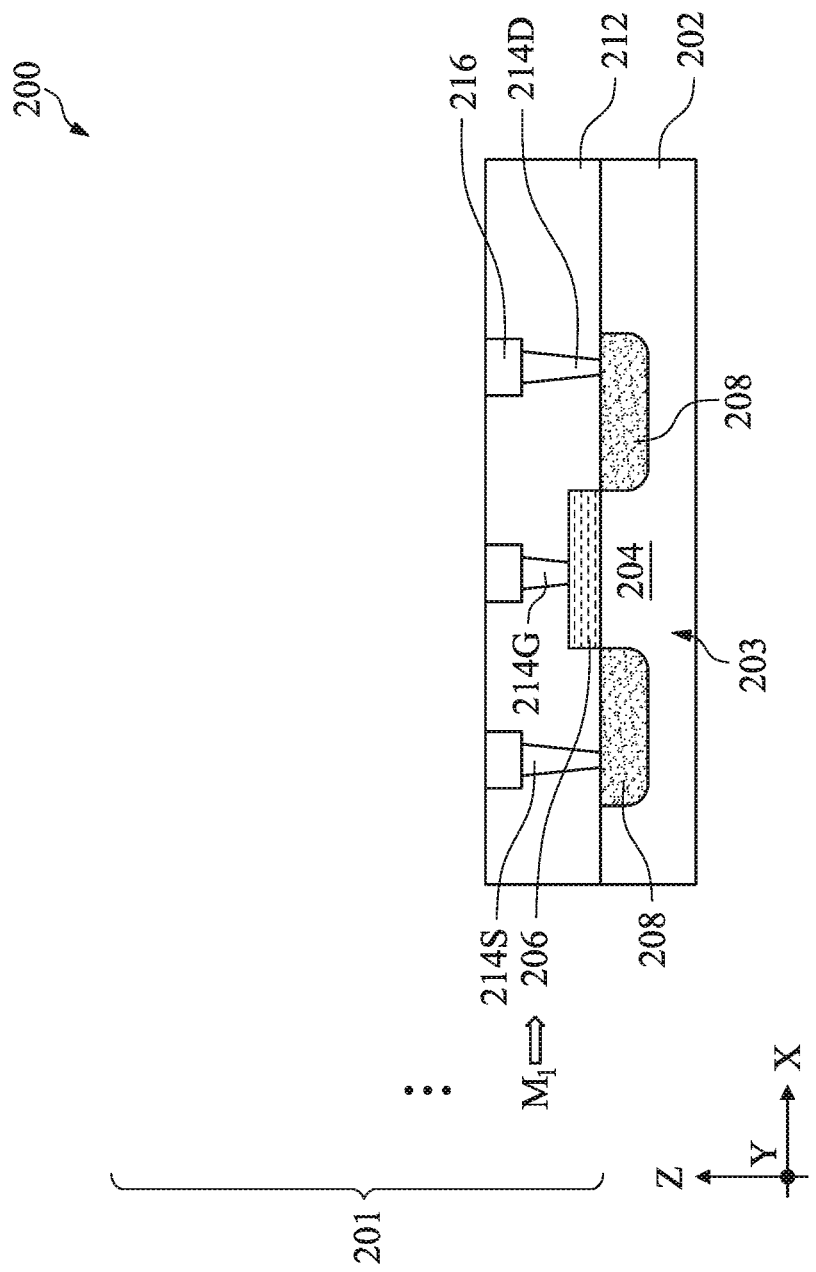
FIGS. 4, 5, 6, 7, 8, 9 10A, 10B, 10C, 10D, 11A, 11B, 11C, 11D, 12A, 12B, 12C, 12D, 13, 14, 15, 16, 17, and 18 are fragmentary cross-sectional views of a workpiece undergoing operations of the example method in FIG. 3, according to various aspects of the present disclosure.

Referring to FIGS. 3 and 4, method 100 includes a block 102 where a device 200 is provided. The device 200 includes a substrate 202. In an embodiment, the substrate 202 includes silicon (Si). Alternatively or additionally, substrate 202 may include another elementary semiconductor, such as germanium (Ge); a compound semiconductor, such as silicon carbide (SiC), gallium arsenide (GaAs), gallium phosphide (GaP), indium phosphide (InP), indium arsenide (InAs), and/or indium antimonide; an alloy semiconductor, such as silicon germanium (SiGe), GaAsP, AlInAs, AlGaAs, GaInAs, GaInP, and/or GaInAsP; or combinations thereof. Alternatively, the substrate 202 may be a semiconductor-on-insulator substrate, such as a silicon-on-insulator (SOI) substrate, a silicon germanium-on-insulator (SGOI) substrate, or a germanium-on-insulator (GeOI) substrate. Semiconductor-on-insulator substrates can be fabricated using separation by implantation of oxygen (SIMOX), wafer bonding, and/or other suitable methods. The substrate 202 can include various doped regions (not shown) depending on design requirements of device 200. In some implementations, the substrate 202 includes p-type doped regions (for example, p-type wells) doped with p-type dopants, such as boron (for example, $BF_2$), indium, other p-type dopant, or combinations thereof. In some implementations, the substrate 202 includes n-type doped regions (for example, n-type wells) doped with n-type dopants, such as phosphorus (P), arsenic (As), other n-type dopant, or combinations thereof. In some implementations, the substrate 202 includes doped regions formed with a combination of p-type dopants and n-type dopants. The various doped regions can be formed directly on and/or in the substrate 202, for example, providing a p-well structure, an n-well structure, a dual-well structure, a raised structure, or combinations thereof. An ion implantation process, a diffusion process, and/or other suitable doping process can be performed to form the various doped regions.

In the depicted embodiments, the device 200 includes a transistor 203 fabricated on the substrate 202. The transistor 203 may be a planar transistor or a multi-gate transistor, such as a fin-like FET (FinFET) or a gate-all-around (GAA) transistor. A GAA transistor may include channel regions of various shapes including nanowire, nanobar, or nanosheet, which may be collectively referred to as nanostructures. A GAA transistor may also be referred to as a multi-bridge-channel (MBC) transistor or a surrounding-gate-transistor (SGT). The transistor 203 representatively shown in FIG. 4 is a planar device that includes a gate structure 206 disposed over a channel region 204 and source/drain regions 208. While the transistor 203 is shown as a planar device in FIG. 4 and subsequent figures, it should be understood that the transistor 203 may as well be a FinFET or a GAA transistor.

While not explicitly shown, the gate structure 206 includes an interfacial layer interfacing the fin structure, a gate dielectric layer over the interfacial layer, and a gate electrode layer over the gate dielectric layer. The interfacial layer may include a dielectric material such as silicon oxide, hafnium silicate, or silicon oxynitride. The interfacial layer may be formed by chemical oxidation, thermal oxidation, atomic layer deposition (ALD), chemical vapor deposition (CVD), and/or other suitable method. The gate dielectric layer may include a high-k dielectric material, such as hafnium oxide. Alternatively, the gate dielectric layer may include other high-K dielectric materials, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), $(Ba,Sr)TiO_3$ (BST), silicon nitride (SiN), silicon oxynitride (SiON), combinations thereof, or other suitable material. The gate dielectric layer may be formed by ALD, physical vapor deposition (PVD), CVD, oxidation, and/or other suitable methods.

The gate electrode layer of the gate structure 206 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof.

The source/drain regions 208 may be doped regions or deposited using vapor-phase epitaxy (VPE), ultra-high vacuum CVD (UHV-CVD), molecular beam epitaxy (MBE), and/or other suitable processes. When the source/drain region 208 is n-type, it may include silicon (Si) doped with an n-type dopant, such as phosphorus (P) or arsenic (As). When the source/drain regions 208 is p-type, it may include silicon germanium (SiGe) doped with a p-type dopant, such as boron (B) or boron difluoride ($BF_2$). In some alternative embodiments not explicitly shown in the figures, the source/drain regions 208 may include multiple layers. In one example, the source/drain region 208 may include a lightly doped first epitaxial layer over source/drain region of the fin structure, a heavily doped second epitaxial layer over the lightly doped first epitaxial layer, and a capping epitaxial layer disposed over the heavily doped second epitaxial layer. The first epitaxial layer has a lower dopant concentration or a smaller germanium content (when germanium is present) than the second epitaxial layer to reduce lattice mismatch defects. The second epitaxial layer has the highest dopant concentration or the highest germanium content (when germanium is present) to reduce resistance and increase strain on the channels. The capping epitaxial layer may have a smaller dopant concentration and germanium content (when germanium is present) than the second epitaxial layer to increase etching resistance.

Although not explicitly shown in FIG. 4, multiple active regions similar to the channel region 204 and the source/drain regions 208 are formed over the substrate 202. The active regions may be isolated from one another by an isolation feature. In some implementations, the isolation features may be formed by etching a trench in substrate 202 or an epitaxial layer on the substrate 202 using a dry etch process and filling the trench with insulator material using a chemical vapor deposition (CVD) process, flowable CVD (FCVD) process, or a spin-on glass process. A chemical mechanical polishing (CMP) process may be performed to remove excessive insulator material and to provide a planar surface. In the depicted embodiment, the isolation feature is formed after the CMP process. When the transistor 203 is a multi-gate transistor that includes a fin structure or a fin-like structure, the insulator material may be etched back to form the isolation feature such that the fin structure or fin-like structure rises above the isolation feature. In some implementations, the isolation features may include a multi-layer structure that includes a liner dielectric layer and bulk dielectric layer. The isolation feature may include silicon oxide, silicon oxynitride, boron silicate glass (BSG), or phosphosilicate glass (PSG). Although not explicitly shown in the figures, when the transistor 203 is a multi-gate transistor, the device 200 may also include middle-end-of-line (MEOL) structures, which may include source/drain contacts and a gate contact via disposed in one or more interlayer dielectric (ILD) layers. The ILD layers may include silicon oxide, tetraethylorthosilicate (TEOS) oxide, un-doped silicate glass (USG), or doped silicate glass such as borophosphosilicate glass (BPSG), fused silicate glass (FSG), phosphosilicate glass (PSG), boron doped silicate glass (BSG), and/or other suitable dielectric materials. The source/drain contacts may include ruthenium (Ru), cobalt (Co), nickel (Ni), or copper (Cu). The gate contact via may include tungsten (W), ruthenium (Ru), cobalt (Co), nickel (Ni), or copper (Cu).

In the embodiments depicted in FIG. 4, the device 200 further includes a part of an interconnect structure 201. The interconnect structure 201 includes multiple metal layers, including the illustrated first metal layer $M_1$, with the dots representing metal layers higher than $M_1$ (e.g., $M_2$, $M_3$, ... $M_{n-1}$ not depicted in FIG. 4). Further metal layers of the interconnect structure 201 will be formed over the $(n-1)^{th}$ metal layer $M_{n-1}$. In some embodiments, the interconnect structure may include about nine (9) to about thirteen (13) metal layer. Each of the metal layers of the interconnect structures include multiple vias and metal lines embedded in at least one intermetal dielectric (IMD) layer. The vias and metal lines may be formed of titanium (Ti), ruthenium (Ru), nickel (Ni), cobalt (Co), copper (Cu), molybdenum (Mo), tungsten (W), or aluminum (Al). In one embodiment, they are formed of copper (Cu). The IMD layer may have a composition similar to that of the ILD layers described above. In the depicted embodiment, the first metal layer $M_1$ includes a via 214S electrically coupled to a source region of the transistor 203 and a metal line 216 disposed on the via 214S, a via 214D electrically coupled to a drain region of the transistor 203 and a metal line 216 disposed on the via 214D, and a via 214G electrically coupled to the gate of the transistor 203 and a metal line 216 disposed on the via 214G. All the vias 214S/214D/214G and the metal lines 216 are embedded or disposed in the first IMD layer 212.

Figure 5:
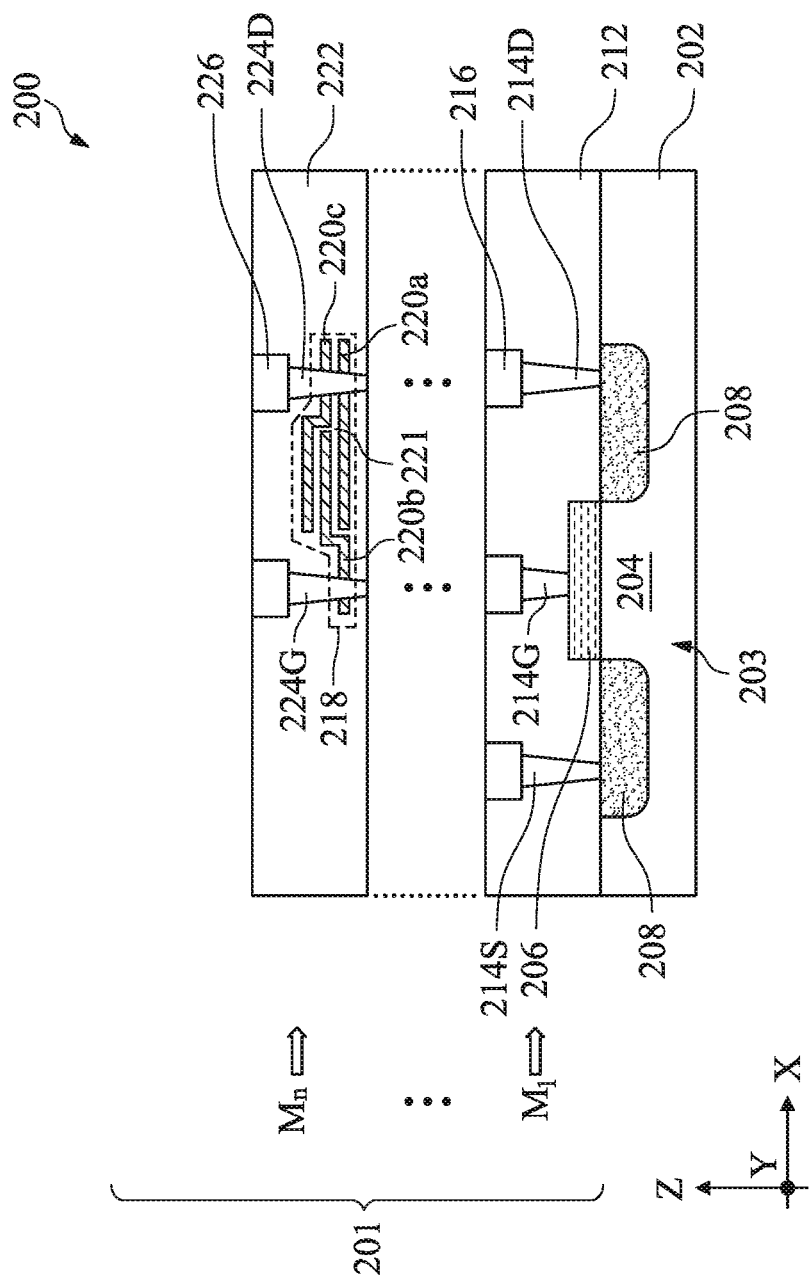

Referring to FIGS. 3 and 5, method 100 includes a block 104 where an $n^{th}$ metal layer $M_n$ is formed over the $(n-1)^{th}$ metal layer $M_{n-1}$. If some embodiments, n is 3 and there is one additional metal layer between the first metal layer $M_1$ and the $n^{th}$ metal layer $M_n$. Similar to the first metal layer $M_1$, the $n^{th}$ metal layer $M_n$ includes a via 224D electrically coupled to the via 214D, thus coupled to the drain region of the transistor 203, and a via 224G electrically coupled to the via 214G, thus coupled to the gate of the transistor 203. Metal lines 226 are disposed on the via 224D and the via 224G, respectively. The vias 224G/224D and the metal lines 226 are embedded or disposed in an $n^{th}$ IMD layer 222.

Method 100 at the block 104 further includes forming a metal-insulator-metal (MIM) capacitor 218 embedded or disposed in the $n^{th}$ IMD layer 222. The MIM capacitor 218 includes a bottom electrode 220a, a middle electrode 220b, a top electrode 220c, and an insulating dielectric layer 221 disposed between adjacent electrodes. Capacitance is formed between the bottom electrode 220a and the middle electrode 220b, as well as between the middle electrode 220b and the top electrode 220c. The total capacitance provided by the MIM capacitor 218 is roughly the sum of capacitance formed between each pair of adjacent electrodes. MIM capacitors offer the advantage of a relatively constant value of capacitance over a relatively wide range of voltages applied thereto. MIM capacitors also exhibit a relatively small parasitic resistance. In the depicted embodiment, the via 224D extends through the top electrode 220c and the bottom electrode 220a, coupling the top electrode 220c and the bottom electrode 220a to the drain region 208 of the transistor 203; the via 224G extends through the middle electrode 220b, coupling the middle electrode 220b to the gate structure 206 of the transistor 203. Thus, the MIM capacitor 218 provides capacitance across a gate terminal and a drain terminal of a transistor. To increase the total capacitance, in some embodiments, the MIM capacitor 218 may have more than one middle electrode, such as two or three middle electrodes, to stack more capacitance. In yet another embodiment, the MIM capacitor 218 may include only the bottom electrode 220a and the top electrode 220c.

In some embodiments, the electrodes 220a, 220b, and 220c comprise titanium nitride (TiN). Alternatively, the electrodes 220a, 220b, and 220c may optionally include tantalum nitride (TaN), tungsten nitride (WN), ruthenium (Ru), iridium (Ir), platinum (Pt), and combinations thereof. Additionally, each electrode may include a stack of two or more layers, such as a stack of titanium nitride and titanium layers or a stack of titanium nitride and tungsten layers. Although not limited by the present disclosure, each electrode may have a thickness ranging from about 10 nm to about 80 nm. The insulating dielectric layer 221 includes a high-k dielectric material such as zirconium oxide ($ZrO_2$). Alternatively, the insulating dielectric layer 221 may optionally include one or more layers of silicon oxide ($SiO_2$), silicon nitride ($Si_3N_4$), silicon oxynitride (SiON), aluminum oxide ($Al_2O_3$), hafnium silicates (HfSiON), tantalum oxide ($Ta_2O_5$), hafnium oxide ($HfO_2$), titanium oxide ($TiO_2$), barium strontium titanate (BST), strontium titanate oxide (STO), or combinations thereof. The insulating dielectric layer 221 between adjacent electrodes may have a thickness ranging from about 2 nm to about 18 nm. In the illustrated embodiment, the insulating dielectric layer 221 includes different material composition from the IMD layer 222.

Figure 6:
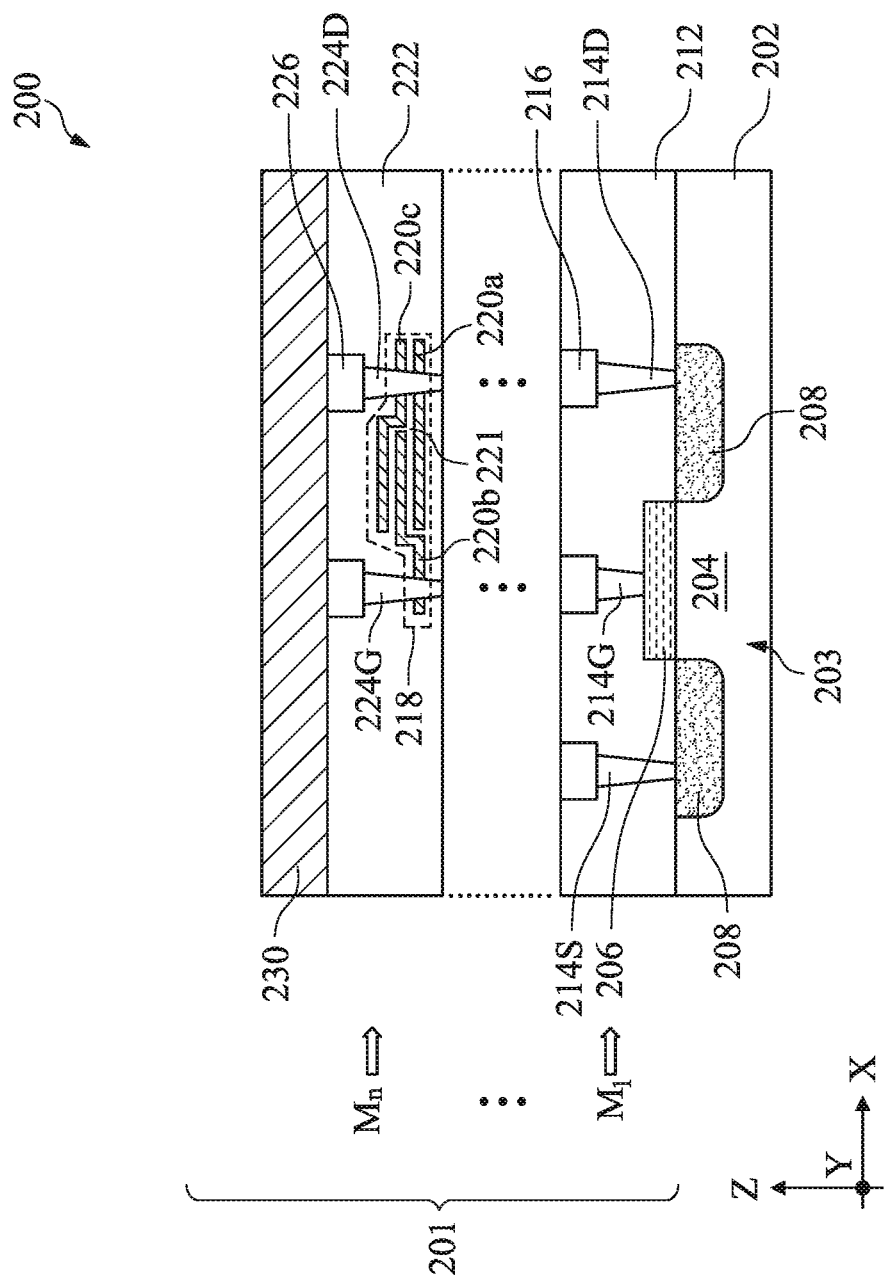

Referring to FIGS. 3 and 6, method 100 includes a block 106 where an etch stop layer (ESL) 230 is deposited over the device 200. In some embodiments, the ESL 230 includes silicon carbide and may be deposited using chemical vapor deposition (CVD) or plasma enhanced CVD (PECVD). The ESL 230 not only serves as an etch stop layer but also functions to prevent electromigration of metals in the top metal line 226 when the top metal line 226 is formed of copper or a copper-containing material. In some implementations, the ESL 230 may have a thickness between about 200 nm and about 350 nm. This thickness is not trivial. When the thickness is less than 200 nm, the ESL 230 may not sufficiently suppress the electromigration in the top metal line 226. When the thickness is greater than 350 nm, the ESL 230 may take too much thickness to prevent the entire process to be performed to metal layers that have a smaller total thickness, such as the first three (3) or the first four (4) metal layers from the device 200.

Figure 7:
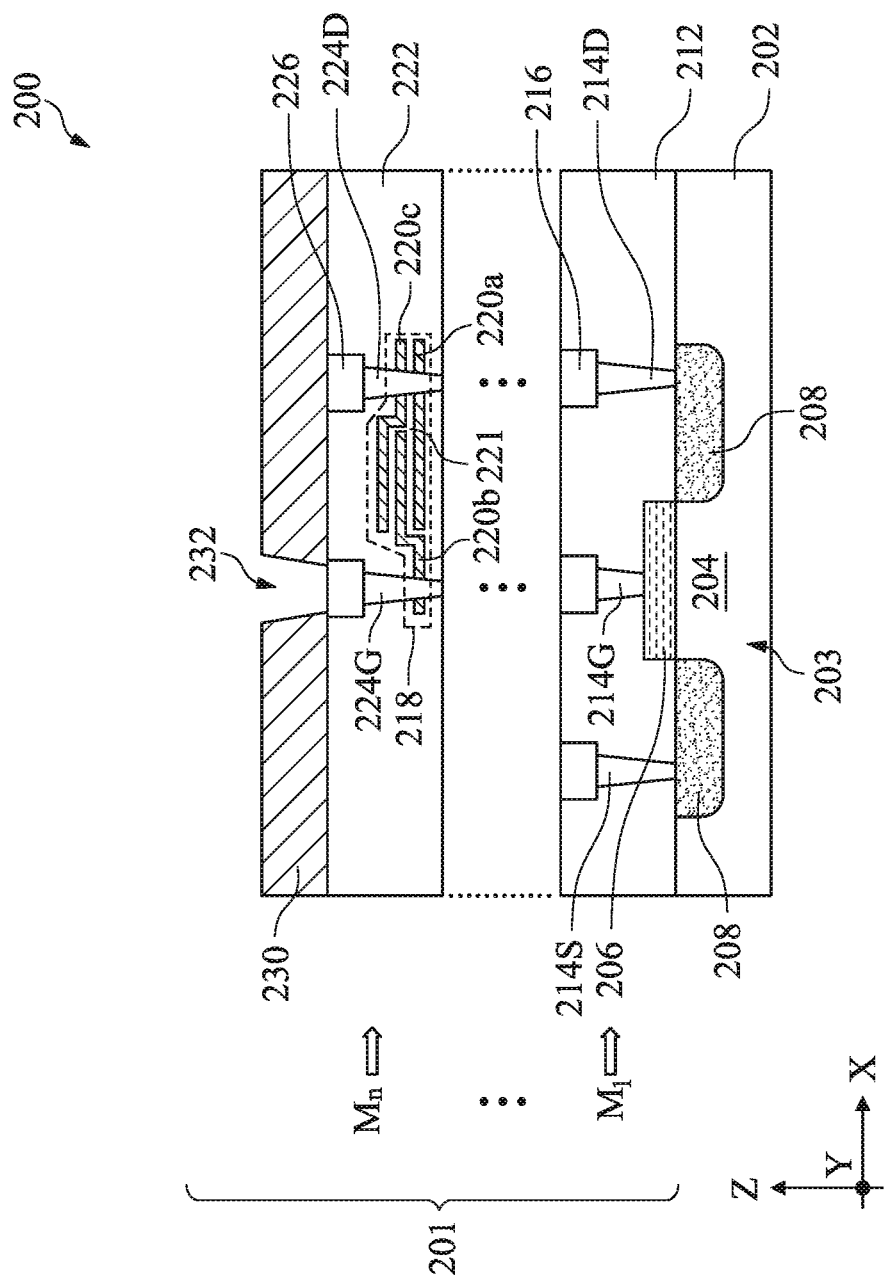

Referring to FIGS. 3 and 7, method 100 includes a block 108 where an opening 232 is formed through the ESL 230 to expose the top metal line 226. The opening 232 may be formed through the ESL 230 using a combination of photolithography processes and etching processes. For example, at least one hard mask is deposited over the ESL 230 using CVD, flowable CVD (FCVD), or a suitable process. A photoresist layer is then deposited over the at least one hard mask layer using spin-on coating. The deposited photoresist layer may undergo an pre-exposure baking process, exposure to radiation reflected from or transmitted through a photomask, a post-exposure baking process, and developing process, so as to form a patterned photoresist. The at least one hard mask layer is then etched using the patterned photoresist as an etch mask to form a patterned hard mask. The patterned hard mask is then applied as an etch mask to etch the ESL 230 to form the opening 232. Appropriate etch process at the block 108 may be a dry etch process, a wet etch process, or a combination thereof. In some embodiments, the etch process at the block 108 may be a dry etch process (e.g., a reactive ion etching (RIE) process) that includes use of an oxygen-containing gas (e.g., $O_2$), a fluorine-containing gas (e.g., $SF_6$ or $NF_3$), or a chlorine-containing gas (e.g., $Cl_2$ and/or $BCl_3$). As shown in FIG. 7, the opening 232 extends completely through the ESL 230 and exposes one of the top metal lines 226 that is coupled to the via 224G and the gate structure 206 of the transistor 203.

Figure 8:
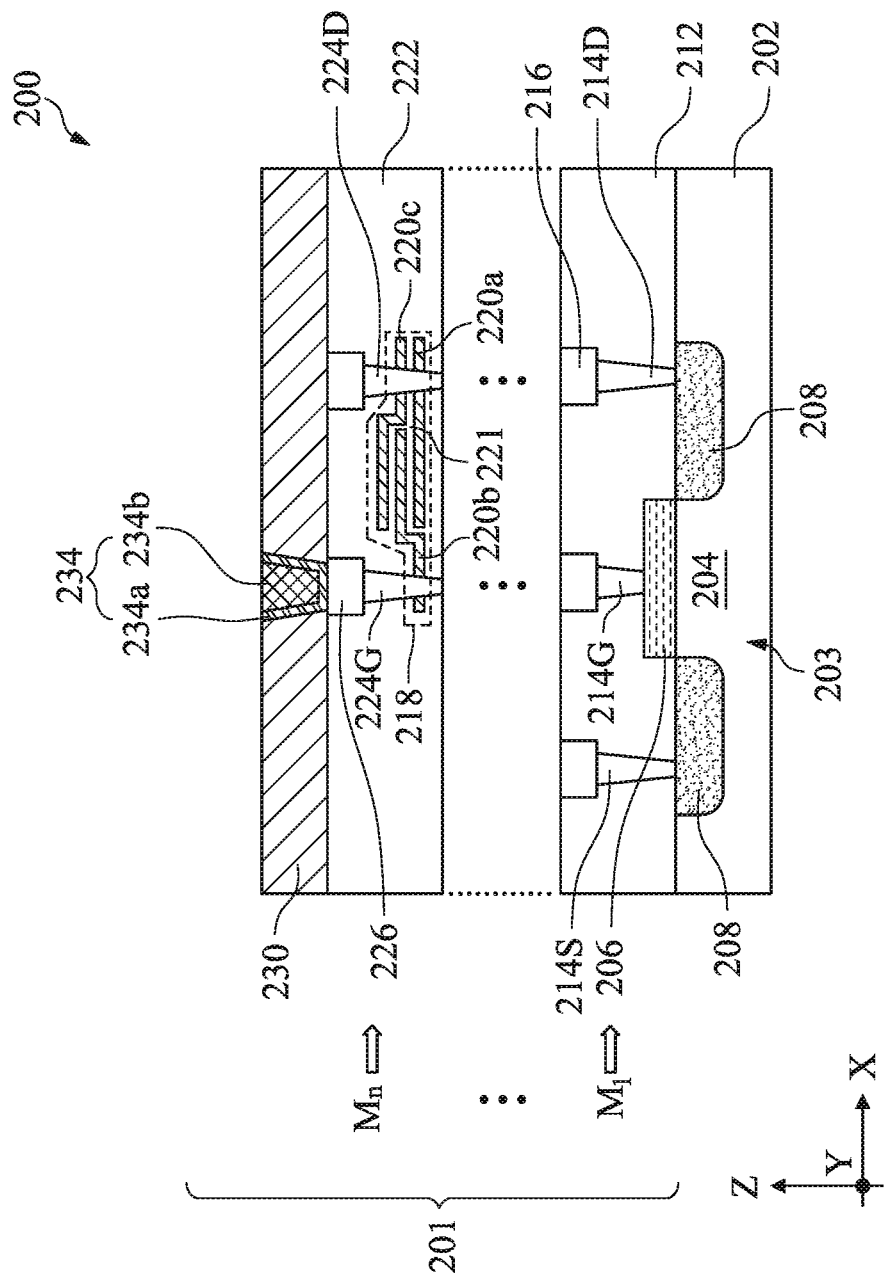

Referring to FIGS. 3 and 8, method 100 includes a block 110 where a contact via 234 is formed in the opening 232 to couple to the top metal line 226. The contact via 234 may include a barrier layer 234a blanketly deposited on sidewalls and bottom surface of the opening 232 and a metal fill layer 234b filling remaining volume of the opening 232. The barrier layer 234a may include a conductive metallic nitride such as TiN, TaN, WN, or combinations thereof. Other suitable materials within the contemplated scope of disclosure may also be used. The metal fill layer 234b may include titanium (Ti), ruthenium (Ru), molybdenum (Mo), tungsten (W), copper (Cu), or aluminum (Al). In one embodiment, the metal fill layer 234b is formed of titanium nitride (TiN) as it tends to reduce electromigration of copper in the underlying top metal line 226. In one example process, conductive material(s) for the contact via 234 is first deposited over the ESL 230 and the opening 232 using CVD or physical vapor deposition (PVD) and then a planarization process, such as a chemical mechanical polishing (CMP) process, is performed to remove excess material over the ESL 230. In another embodiment, the conductive material(s) in the contact via 234 may be deposited using a bottom-up deposition method, such as atomic layer deposition (ALD) or metal organic CVD (MOCVD). In the latter example, the contact via 234 may be selectively deposited on the conductive surface of the top metal line 226 that is exposed via the opening 232.

Figure 9:
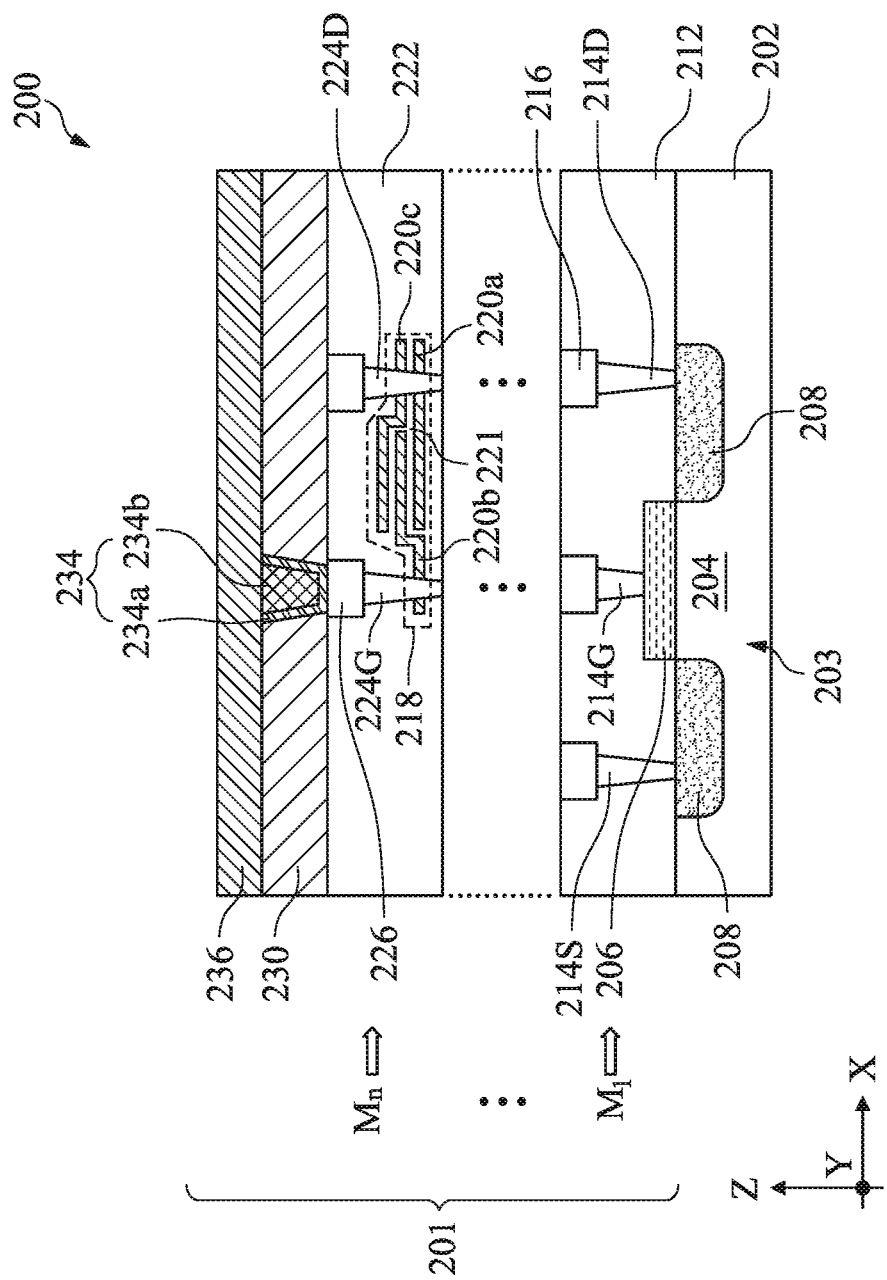

Referring to FIGS. 1 and 9, method 100 includes a block 112 where a bottom electrode layer 236 is deposited over the contact via 234 and the ESL 230. The material composition in the bottom electrode layer 236 is substantially similar to the bottom electrode 16 (FIGS. 1A and 1B) discussed above. The bottom electrode 236 may be a metal layer, a metal-nitride layer, a metal-oxide layer, or a semiconductor layer.

In one example, the bottom electrode 236 may include Al, Ti, Ta, Au, Pt, W, Ni, Ir, other suitable metal, alloys thereof (e.g., TaN, TiN, and/or other suitable alloy), or combinations thereof. In another example, the bottom electrode 236 may include a metal oxide, such as IrO$_2$. In yet another example, the bottom electrode 236 may include a semiconductor material, such as Si, Ge, SiGe, polysilicon (n-type doped or p-type doped), a III-V compound semiconductor (e.g., including but not limited to InAs, AlAs, GaAs, InP, GaN, InGaAs, InAlAs, GaSb, AlSb, AlP, GaP, or the like), or combinations thereof. The bottom electrode layer 236 is blanketly deposited over the top surface of the device 200, including top surfaces of the ESL 230 and the contact via 234, using PVD or CVD. In some instances, the bottom electrode layer 236 may have a thickness between about 10 nm and about 20 nm.

Referring to FIGS. 3 and 10A-10D, method 100 includes a block 114 where an insulator layer 238 having a step-profile top surface and a semiconductor layer 240 having a step-profile bottom surface that conjugate with the top surface of the insulator layer 238 are deposited sequentially on the bottom electrode layer 236. The material composition in the insulator layer 238 is substantially similar to the insulator layer 26 (FIG. 1B) discussed above. In some embodiments, the insulator layer 238 includes a dielectric material having a dielectric constant (k) smaller than about 9 (e.g., k<9). For example, the insulator layer 238 may include a metal oxide, such as $Al_xO_y$, $Si_xO_y$, $Ta_xO_y$, $Ti_xO_y$, $La_xO_y$, $Y_xO_y$, $Sr_xTiO_z$, or combinations thereof, where x, y, z are atom percentages.

Figure 10A:
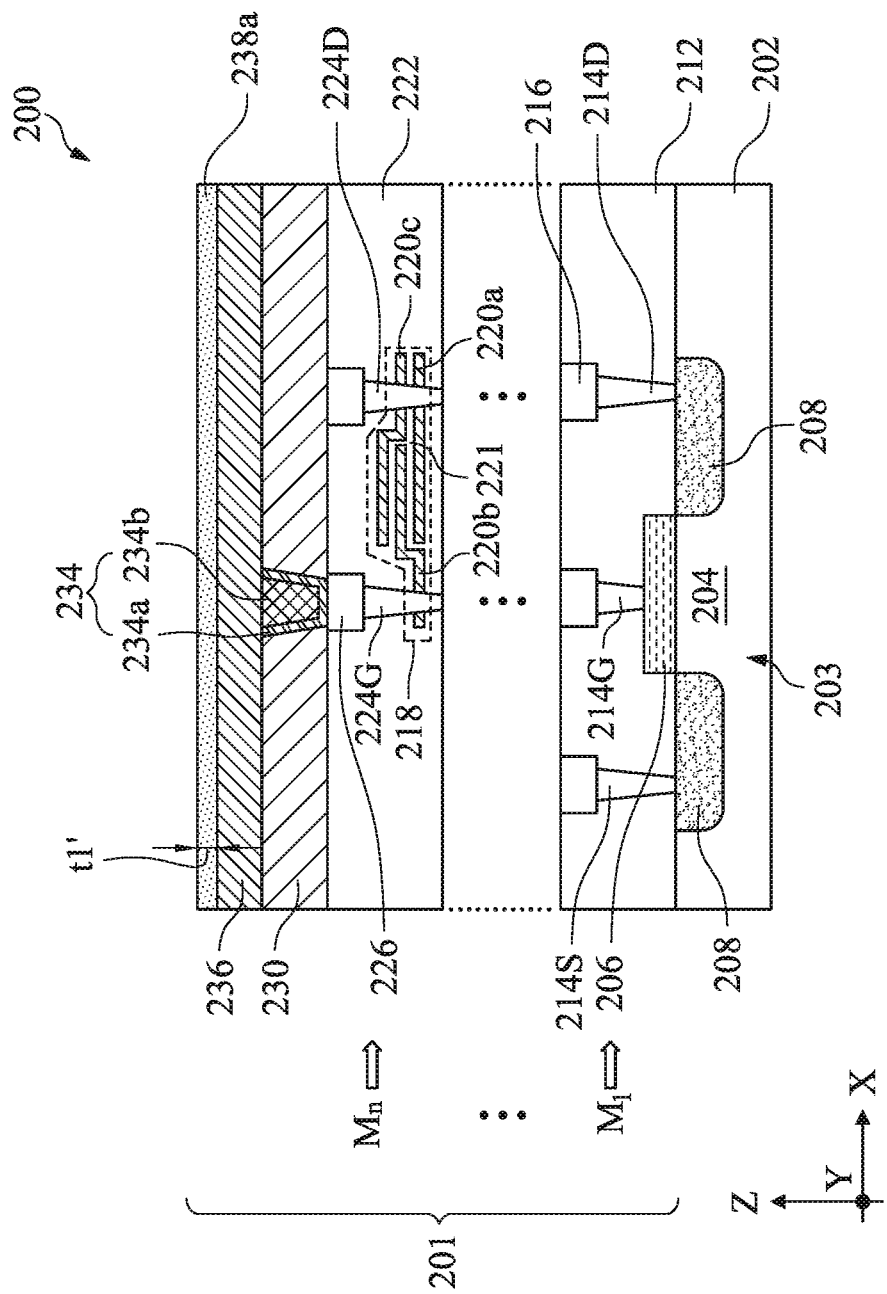

Referring to FIG. 10A, a first layer 238a of the insulator layer 238 is deposited by chemical vapor deposition (CVD), physical vapor deposition (PVD), atomic layer deposition (ALD), high density plasma CVD (HDPCVD), metalorganic chemical vapor deposition (MOCVD), remote plasma CVD (RPCVD), plasma enhanced CVD (PECVD), low-pressure CVD (LPCVD), atomic layer CVD (ALCVD), atmospheric pressure CVD (APCVD), other suitable methods, or combinations thereof. In the depicted embodiment, the first layer 238a is formed by a conformal deposition process, such that the first layer 238a has a substantial uniform thickness over various surfaces. In some embodiments, forming the first layer 238a includes depositing a dielectric material, where deposition parameters of the deposition processes (e.g., deposition precursor flow rates, deposition temperature, deposition time, and/or deposition pressure) are configured (tuned) to control the growth of the first layer 238a stops at a thickness t1'. The thickness t1' is selected that optimizes performance. In some embodiments, the thickness t1' ranges from about 1 nm to about 10 nm.

Figure 10B:
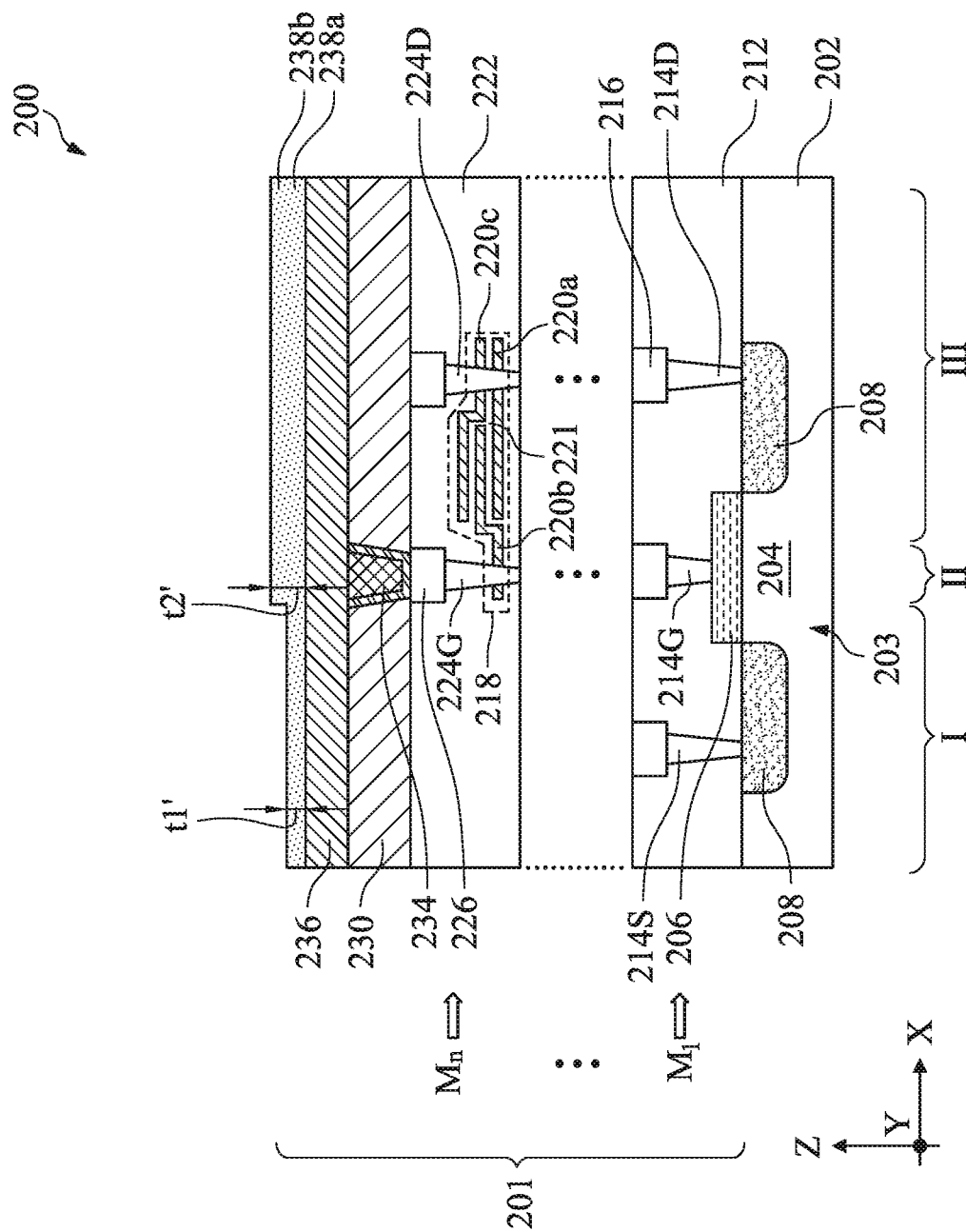

Referring to FIG. 10B, a second layer 238b of the insulator layer 238 is deposited above a portion of the first layer 238a. In the depicted embodiment, a portion of the first layer 238a in a region I is not covered by the second layer 238b, and the deposition of the second layer 238b is limited to regions II and III. The second layer 238b includes substantially the same material as in the first layer 238a. A patterned mask layer (not shown) may be formed over the device 200, covering the first layer 238a in the region I. The patterned mask layer can be a resist layer, a hard mask layer, other suitable patterning layer, or combinations thereof. The second layer 238b of the insulator layer 238 is deposited by CVD, PVD, ALD, FCVD, HDPCVD, MOCVD, RPCVD, PECVD, LPCVD, ALCVD, APCVD, other suitable methods, or combinations thereof. In the depicted embodiment, the second layer 238b is formed by a conformal deposition process, such that the second layer 238b has a substantial uniform thickness in the regions II and III. In some embodiments, forming the second layer 238b includes depositing a dielectric material, where deposition parameters of the deposition processes (e.g., deposition precursor flow rates, deposition temperature, deposition time, and/or deposition pressure) are configured (tuned) to control the growth of the second layer 238b such that a sum of the total thicknesses of the first layer 238a and the second layer 238b is at a thickness t2'. The thickness t2' is selected that optimizes performance. In some embodiments, the thickness t2' ranges from about 1 nm to about 10 nm, and a difference between the thicknesses t2' and t1' ranges from about 1 nm to about 10 nm.

Figure 10C:
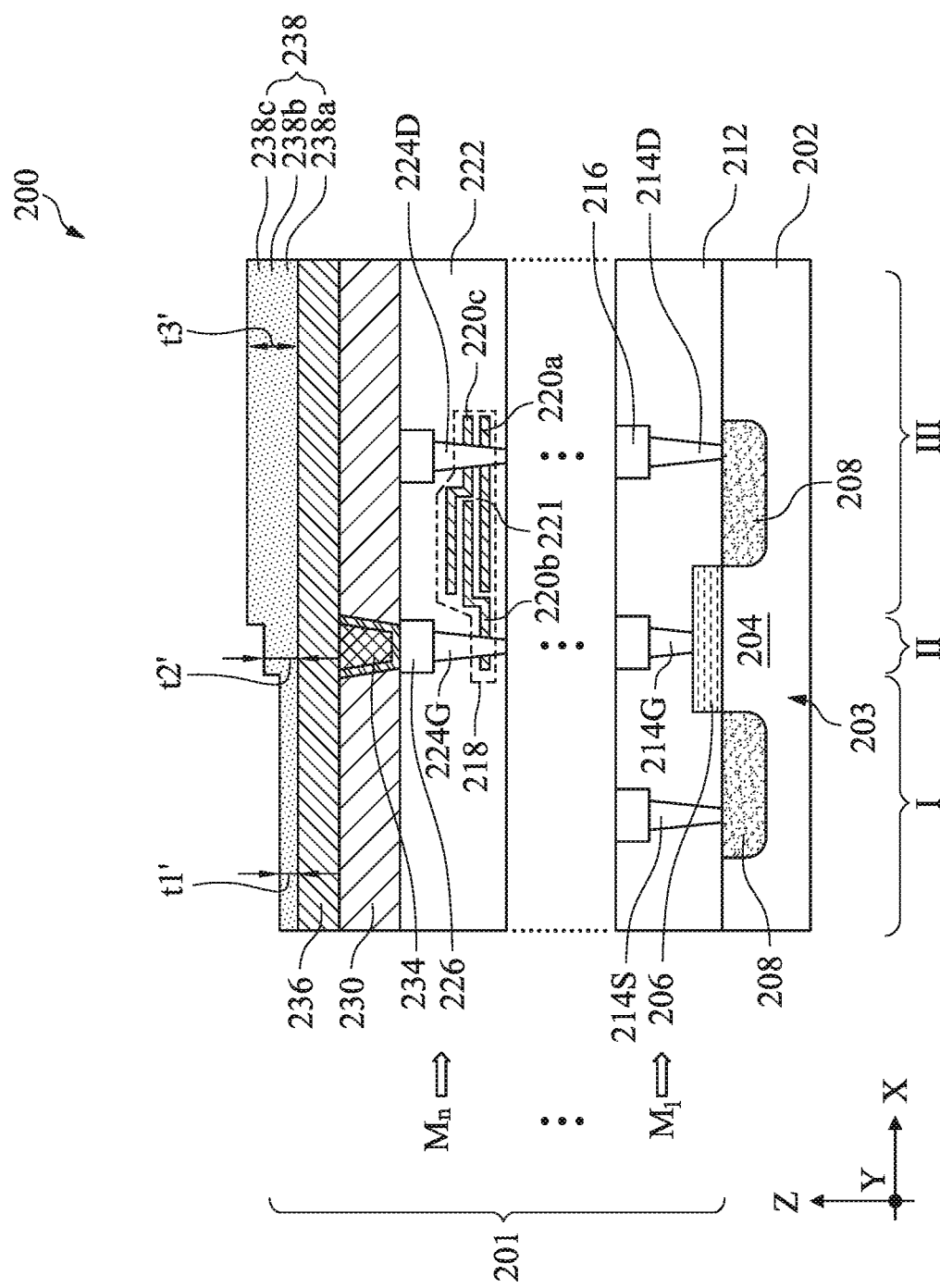

Referring to FIG. 10C, a third layer 238c of the insulator layer 238 is deposited above a portion of the second layer 238b. In the depicted embodiment, a portion of the first layer 238a in the region I and a portion of the second layer 238b in the region II are not covered by the third layer 238c, and the deposition of the third layer 238c is limited to region III. The third layer 238c includes substantially the same material as in the first layer 238a and the second layer 238b. A patterned mask layer (not shown) may be formed over the device 200, covering the first layer 238a in the region I and the second layer 238b in the region II. The patterned mask layer can be a resist layer, a hard mask layer, other suitable patterning layer, or combinations thereof. The third layer 238c of the insulator layer 238 is deposited by CVD, PVD, ALD, FCVD, HDPCVD, MOCVD, RPCVD, PECVD, LPCVD, ALCVD, APCVD, other suitable methods, or combinations thereof. In the depicted embodiment, the third layer 238c is formed by a conformal deposition process, such that the third layer 238c has a substantial uniform thickness in the region III. In some embodiments, forming the third layer 238c includes depositing a dielectric material, where deposition parameters of the deposition processes (e.g., deposition precursor flow rates, deposition temperature, deposition time, and/or deposition pressure) are configured (tuned) to control the growth of the third layer 238c such that a sum of the total thicknesses of the first layer 238a, the second layer 238b, and the third layer 238c is at a thickness t3'. The thickness t3' is selected that optimizes performance. In some embodiments, the thickness t3' ranges from about 1 nm to about 10 nm, and a difference between the thicknesses t3' and t2' ranges from about 1 nm to about 10 nm. The first layer 238a, the second layer 238b, and the third layer 238c collectively define the insulator layer 238 with different thicknesses (e.g., t1', t2', t3') in different portions (e.g., regions I, II, III), and accordingly a step-profile top surface. As a comparison, the bottom surface of the insulator layer 238 is in a plane. After the formation of the insulator layer 238, pattern mask layers are removed in an etching process.

Figure 10D:
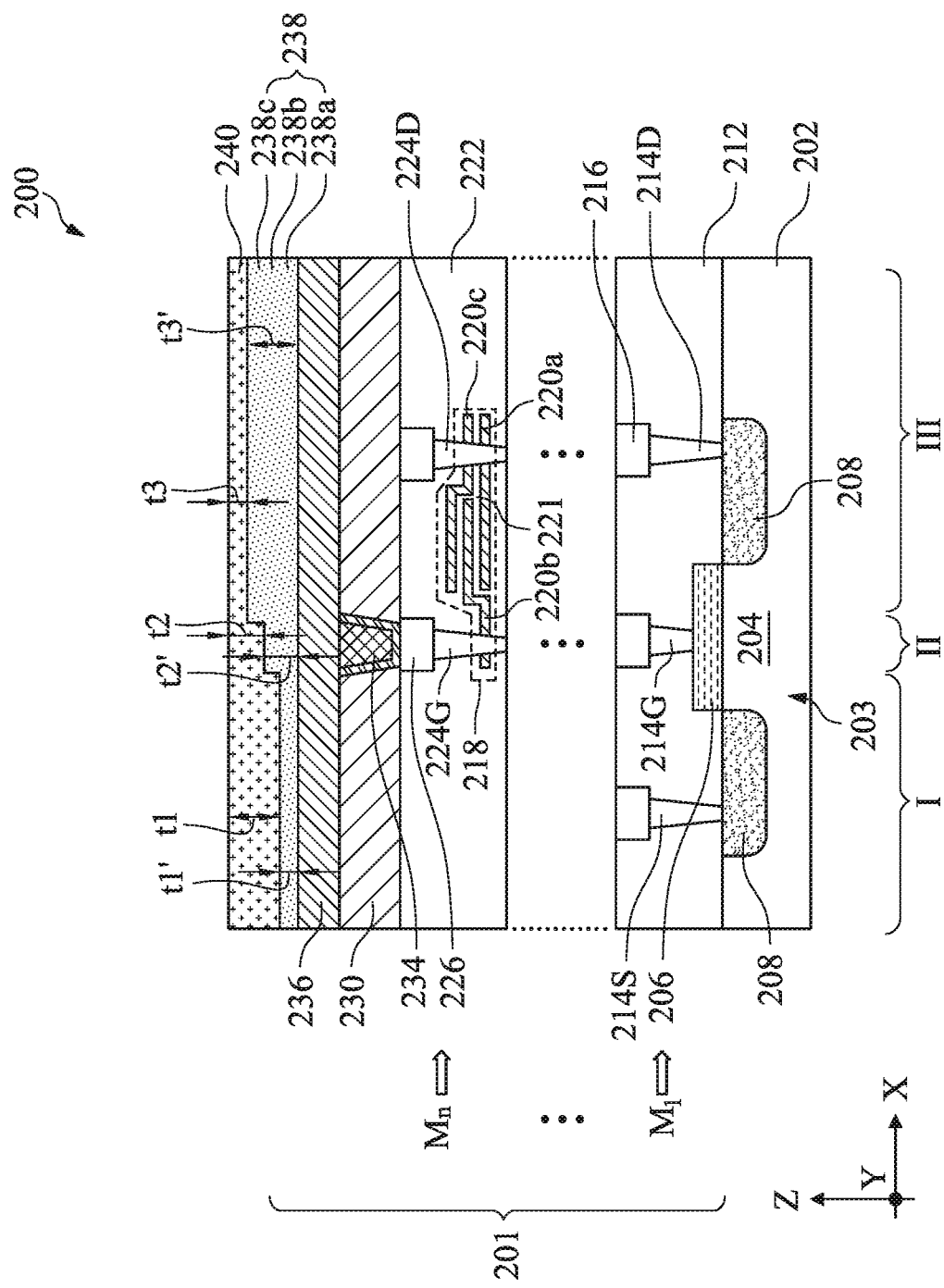

Referring to FIG. 10D, a semiconductor layer 240 having a step-profile bottom surface that conjugate with the top surface of the insulator layer 238 is deposited on the insulator layer 238. The thicknesses of the semiconductor layer 240 in the regions I, II, III are denoted as t1, t2, t3, respectively. The term "conjugate" refers to that a sum of the thicknesses of the semiconductor layer 240 and the insulator layer 238 in different regions is a same predetermined value (e.g., t1+t1'=t2+t2'=t3+t3'). The material composition in the semiconductor layer 240 is substantially similar to the semiconductor layer 24 (FIG. 1B) discussed above. In some embodiments, the semiconductor layer 240 includes a semiconductor material, such as Si, Ge, SiGe, polysilicon (n-type doped or p-type doped), a III-V compound semiconductor (e.g., including but not limited to InAs, AlAs, GaAs, InP, GaN, InGaAs, InAlAs, GaSb, AlSb, AlP, GaP, or the like), or combinations thereof. The semiconductor layer 240 is deposited by CVD, PVD, ALD, FCVD, HDPCVD, MOCVD, RPCVD, PECVD, LPCVD, ALCVD, APCVD, other suitable methods, or combinations thereof. A planarization process, such as a chemical mechanical polishing (CMP) process, may be performed to remove excessive semiconductor material to provide a planar surface. The duration of the planarization process is controlled such that the thicknesses t1, t2, and t3 optimize performance. Each of the thicknesses t1, t2, t3 may be not larger than about 10 nm. In some embodiments, the difference between thicknesses t1 and t2 (e.g., t1−t2) ranges from about 1 nm to about 10 nm, and the difference between thicknesses t2 and t3 (e.g., t2−t3) ranges from about 1 nm to about 10 nm. The thicknesses t1, t2, t3 are also referred to as barrier widths, as one function of the semiconductor layer 240 is to create depletion region in an FSL stack.

Reference is now made to FIGS. 11A-11D, which depict an alternative embodiment of method 100 at the block 114 where an insulator layer 238 having a step-profile top surface and a semiconductor layer 240 having a step-profile bottom surface that conjugate with the top surface of the insulator layer 238 are deposited sequentially on the bottom electrode layer 236.

Figure 11A:
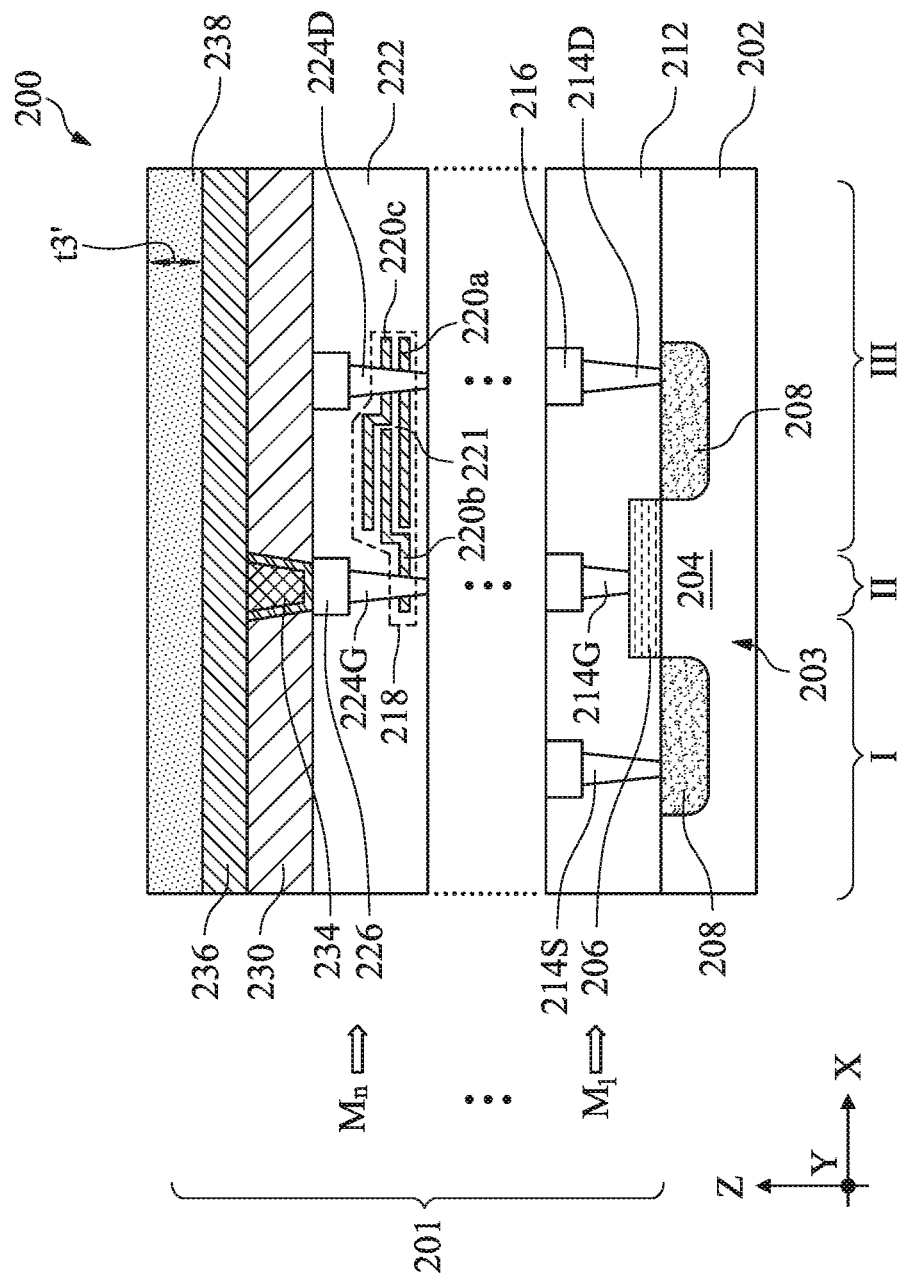

Referring to FIG. 11A, the insulator layer 238 is deposited CVD, PVD, ALD, FCVD, HDPCVD, MOCVD, RPCVD, PECVD, LPCVD, ALCVD, APCVD, other suitable methods, or combinations thereof. In the depicted embodiment, the insulator layer 238 is formed by a conformal deposition process, such that the insulator layer 238 has a substantial uniform thickness over the regions I, II, III. The deposition parameters of the deposition processes (e.g., deposition precursor flow rates, deposition temperature, deposition time, and/or deposition pressure) are configured (tuned) to control the growth of the insulator layer 238 stops at the thickness t3'.

Figure 11B:
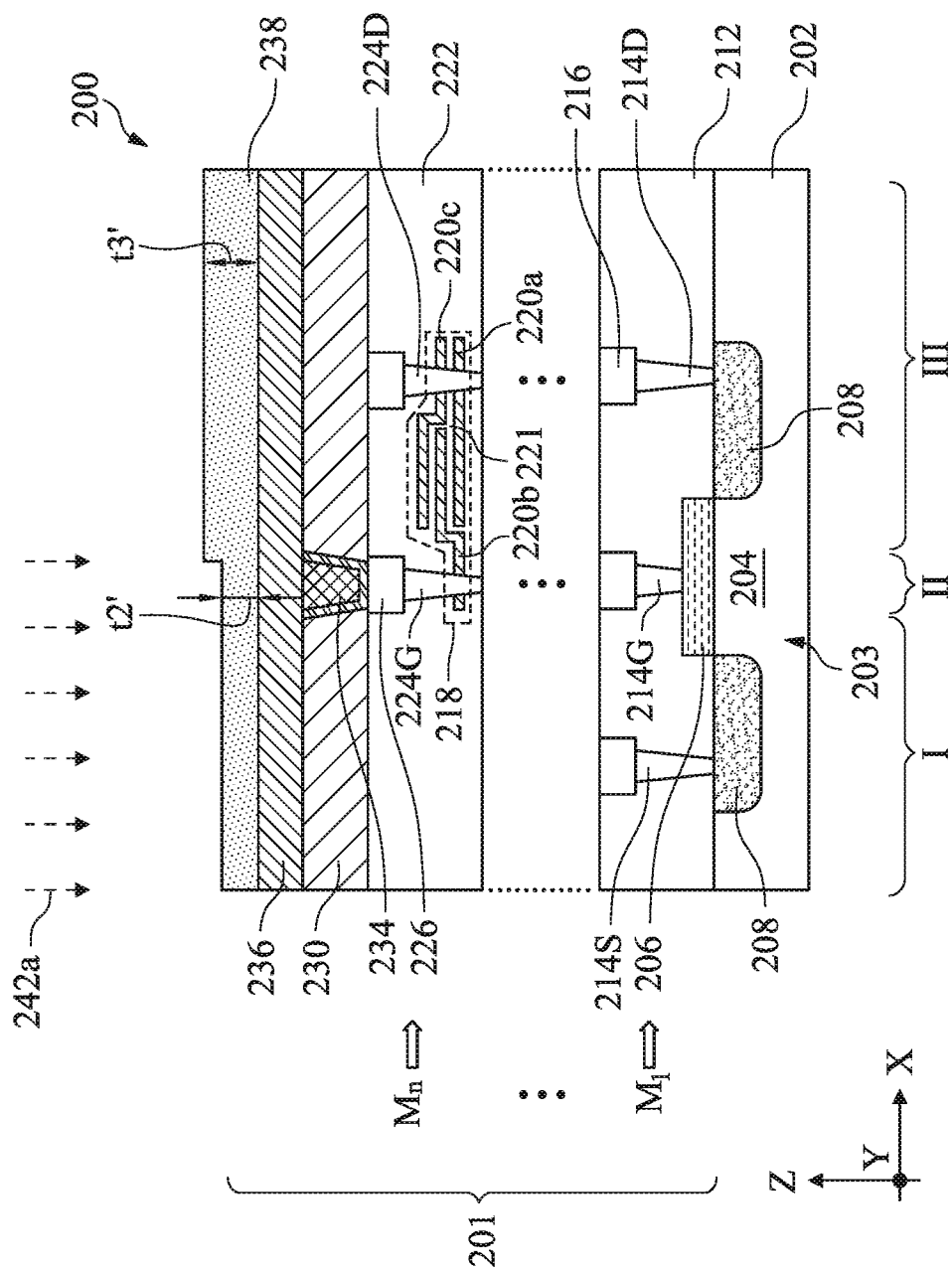

Referring to FIG. 11B, an etching process 242a is performed to recess a portion of the insulator layer 238 in the regions I and II. A patterned mask layer (not shown) may be formed over the device 200, covering the insulator layer 238 in the region III. The patterned mask layer can be a resist layer, a hard mask layer, other suitable patterning layer, or combinations thereof. The etching process 242a includes a dry etching process, a wet etching process, other suitable etching process, or combinations thereof. The etching process 242a is a selective etching process, such that the etching process recesses the insulator layer 238 in the regions I and II, but the patterned mask layer and the other portions of the insulator layer 238 in the region III substantially remain intact. The etching parameters of the etching process 242a (e.g., etchant flow rate, etching duration, and/or etching temperature) are configured (tuned) to control the remaining thickness of the insulator layer 238 stops at the thickness t2'. The patterned mask layer is subsequently removed, such as by etching.

Figure 11C:
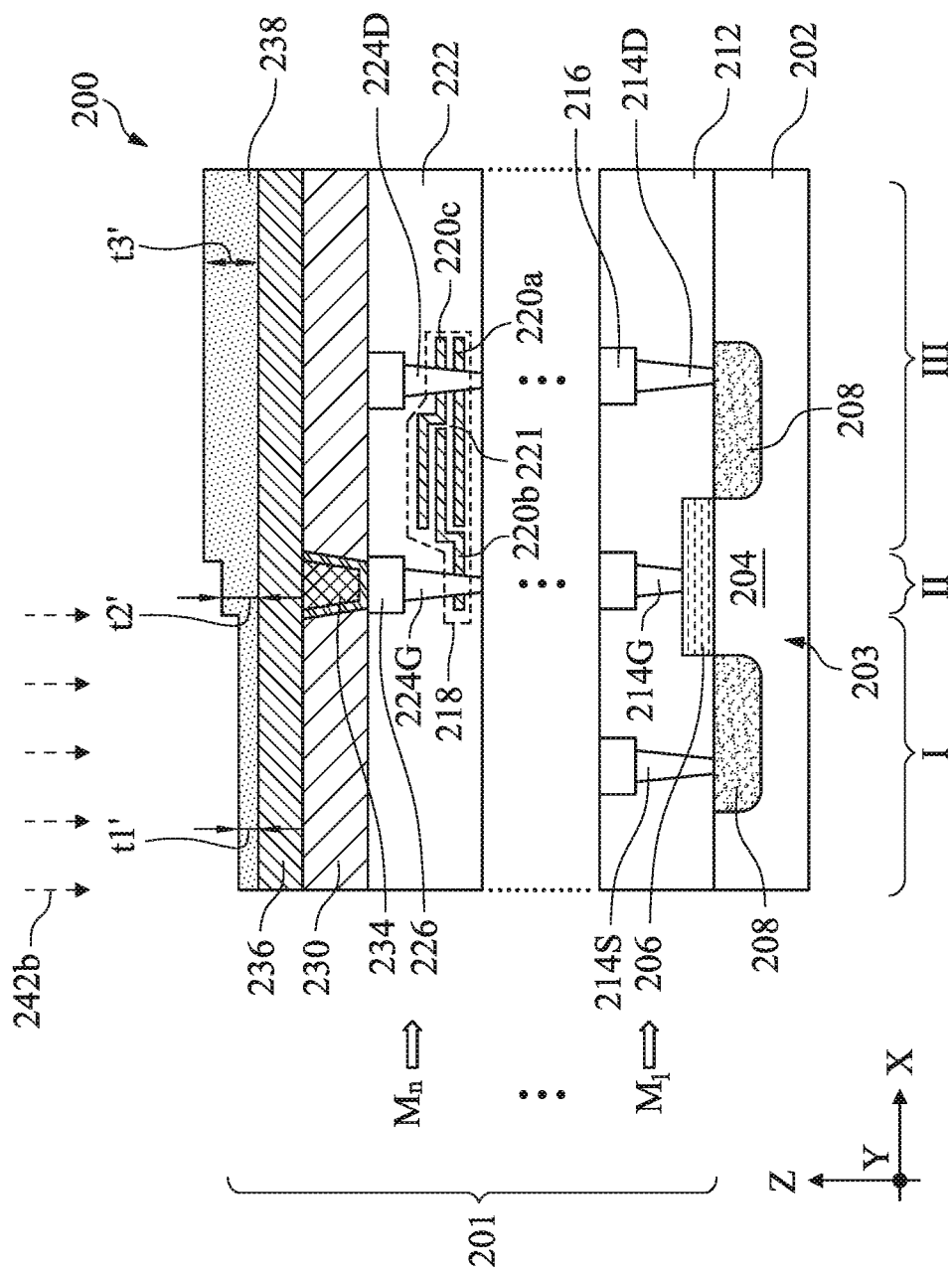

Referring to FIG. 11C, another etching process 242b is performed to recess a portion of the insulator layer 238 in the region I. A patterned mask layer (not shown) may be formed over the device 200, covering the insulator layer 238 in the regions II and III. The patterned mask layer can be a resist layer, a hard mask layer, other suitable patterning layer, or combinations thereof. The etching process 242b includes a dry etching process, a wet etching process, other suitable etching process, or combinations thereof. The etching process 242b is a selective etching process, such that the etching process recesses the insulator layer 238 in the region I, but the patterned mask layer and the other portions of the insulator layer 238 in the regions II and III substantially remain intact. The etching parameters of the etching process 242b (e.g., etchant flow rate, etching duration, and/or etching temperature) are configured (tuned) to control the remaining thickness of the insulator layer 238 stops at the thickness t1'. The patterned mask layer is subsequently removed, such as by etching.

Figure 11D:
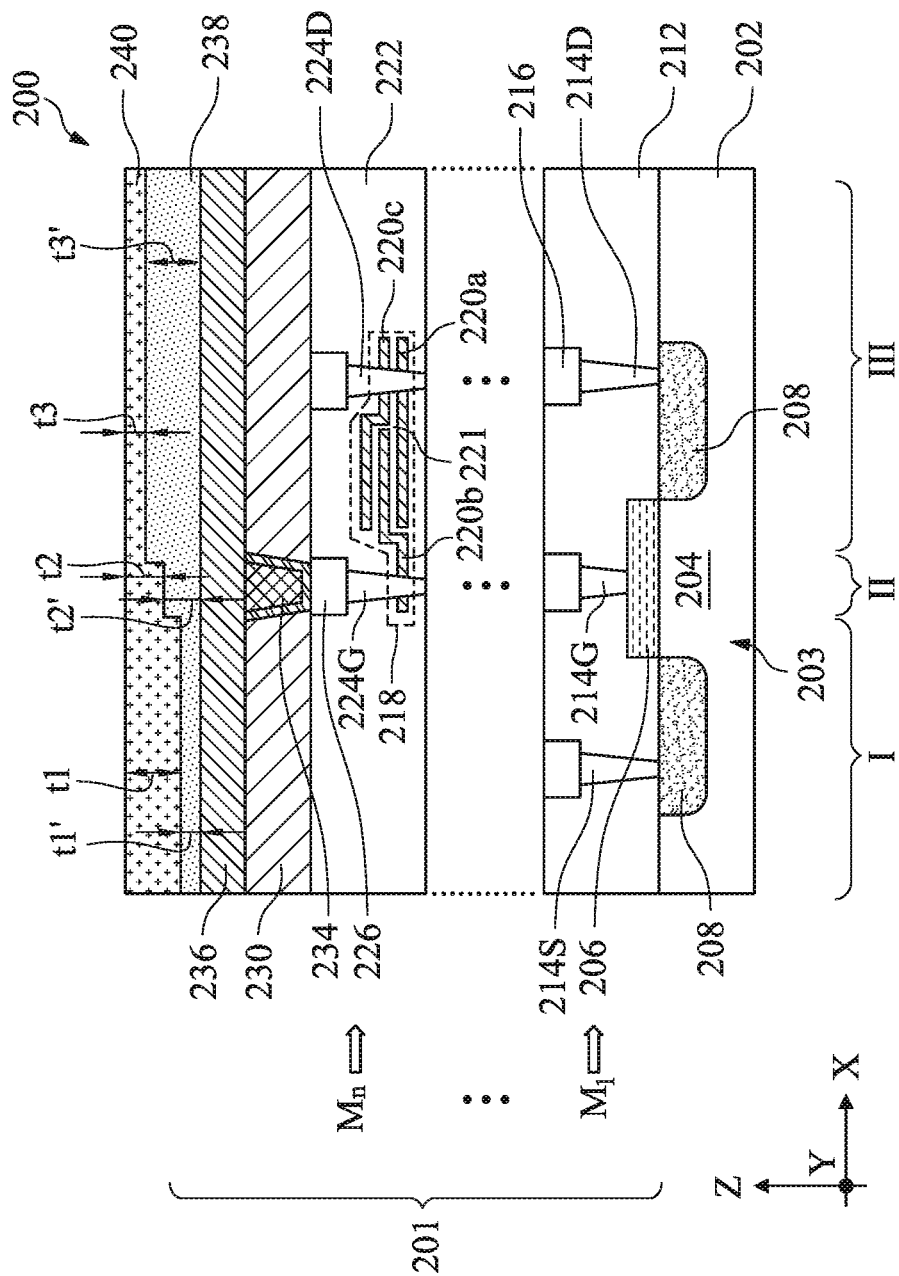

Referring to FIG. 11D, a semiconductor layer 240 having a step-profile bottom surface that conjugate with the top surface of the insulator layer 238 is deposited on the insulator layer 238. The semiconductor layer 240 is deposited by CVD, PVD, ALD, FCVD, HDPCVD, MOCVD, RPCVD, PECVD, LPCVD, ALCVD, APCVD, other suitable methods, or combinations thereof. A planarization process, such as a chemical mechanical polishing (CMP) process, may be performed to remove excessive semiconductor material to provide a planar surface. The duration of the planarization process is controlled such that the thicknesses t1, t2, and t3 optimize performance, as discussed above.

Reference is now made to FIGS. 12A-12D, which depict an alternative embodiment of method 100 at the blocks 112 and 114 where a semiconductor layer is deposited and a buried oxide layer with a step-profile top surface is subsequently formed in the semiconductor layer. The buried oxide layer functions as the insulator layer 238. The portion of the semiconductor layer below the insulator layer 238 is regarded as the bottom electrode layer 236, and the other portion of the semiconductor layer above the insulator layer 238 is regarded as the semiconductor layer 240. In this alternative embodiment, the semiconductor layer 240 and the bottom electrode layer 236 include the same material composition, such as silicon (Si).

Figure 12A:
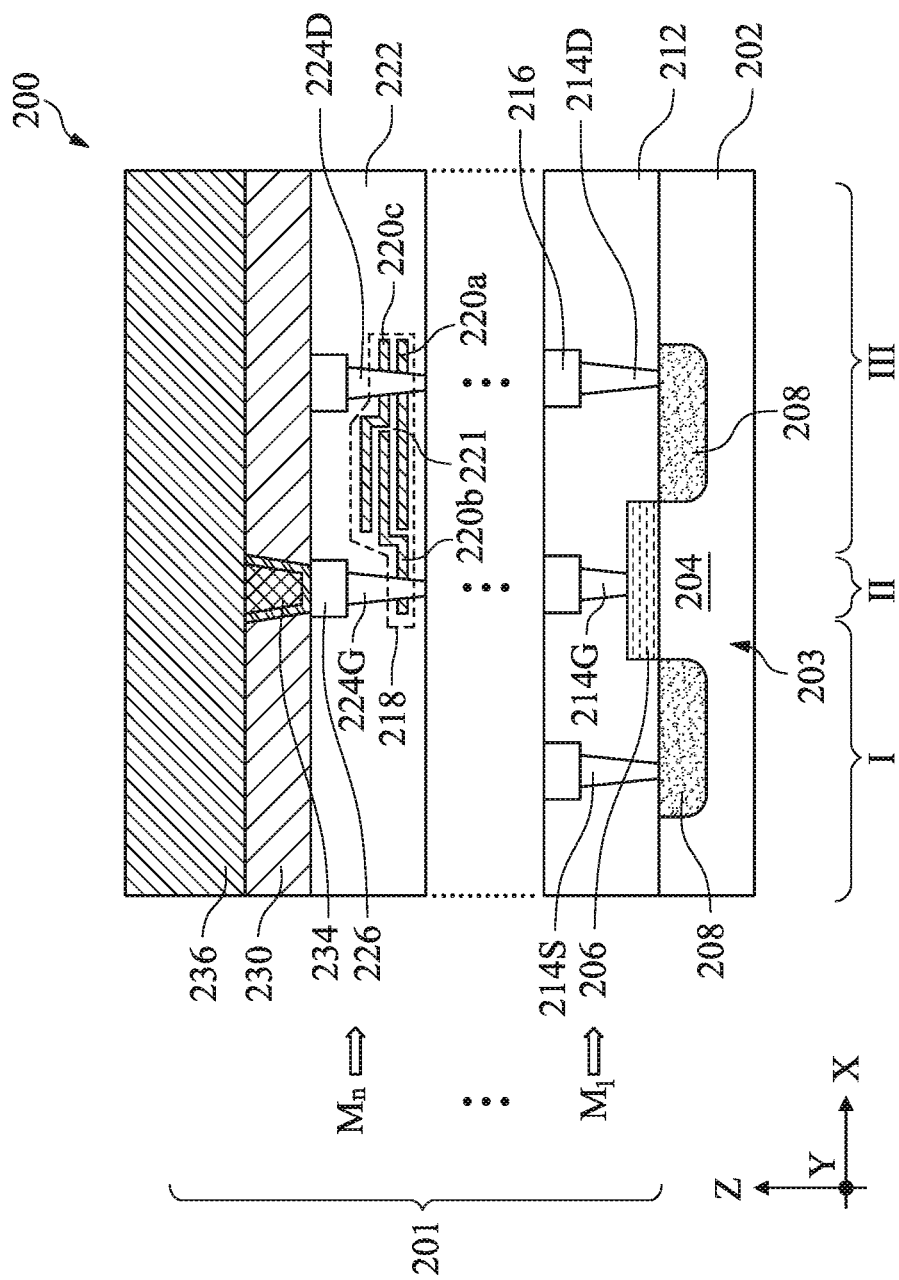

Referring to FIG. 12A, method 100 at block 112 forms a semiconductor layer 236 over the contact via 234 and the ESL 230. In some embodiments, the semiconductor layer 236 includes a semiconductor material, such as Si, Ge, SiGe, polysilicon (n-type doped or p-type doped), a III-V compound semiconductor (e.g., including but not limited to InAs, AlAs, GaAs, InP, GaN, InGaAs, InAlAs, GaSb, AlSb, AlP, GaP, or the like), or combinations thereof. The semiconductor layer 236 is deposited by CVD, PVD, ALD, FCVD, HDPCVD, MOCVD, RPCVD, PECVD, LPCVD, ALCVD, APCVD, other suitable methods, or combinations thereof. A planarization process, such as a chemical mechanical polishing (CMP) process, may be performed to remove excessive semiconductor material to provide a planar surface.

Figure 12B:
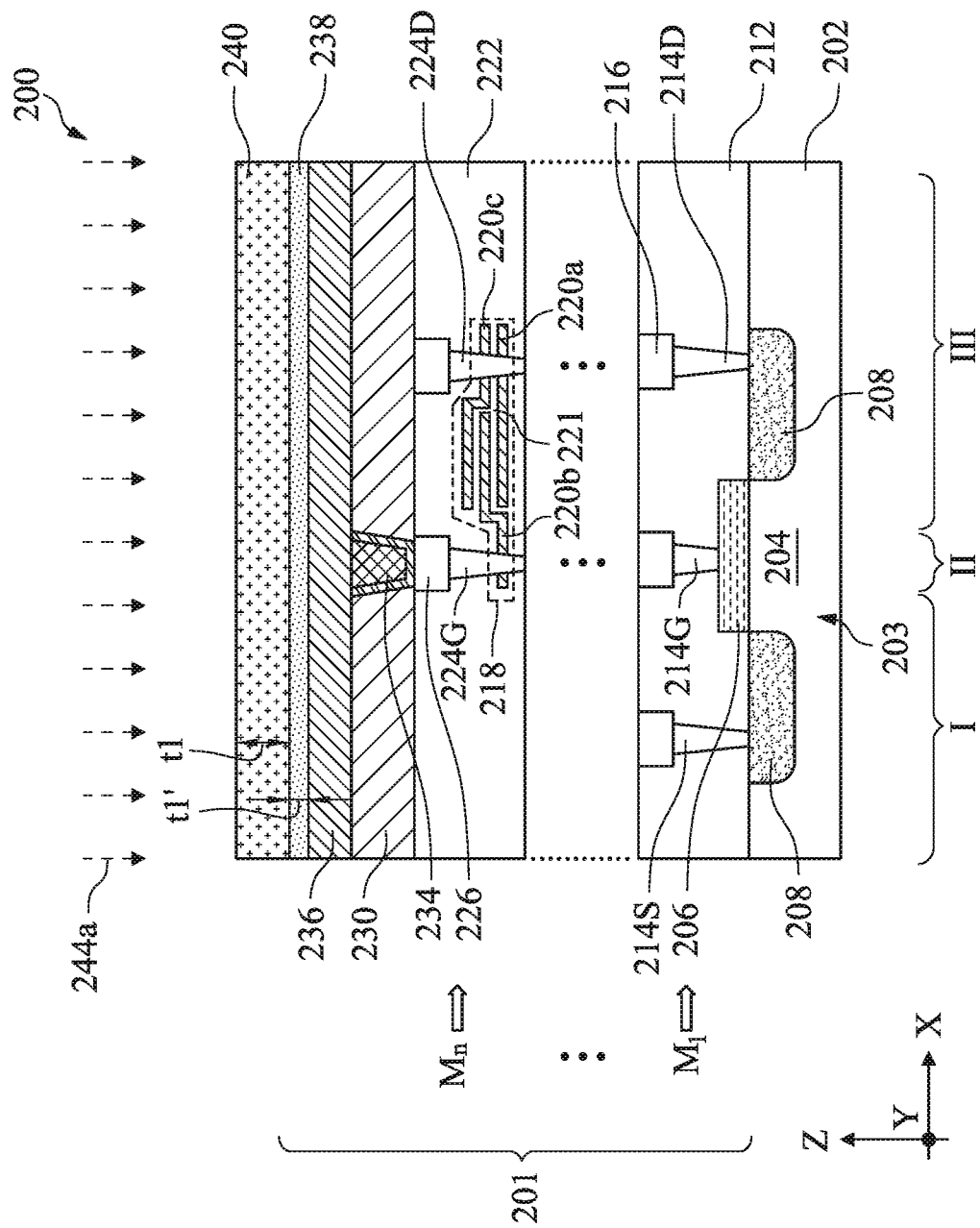

Referring to FIG. 12B, method 100 at block 114 forms a buried oxide layer 238 in the semiconductor layer 236. For example, the buried oxide layer 238 may be formed by a process referred to as separation by implanted oxygen (SIMOX). The SIMOX technology is based on ion-implanting a high-dose of oxygen ions into a semiconductor substrate, such that the peak concentration lies beneath the semiconductor surface. After an implantation process 244a over the regions I, II, III, the device 200 is subjected to an anneal process to form a continuous stoichiometric subsurface-layer of oxide layer (e.g., silicon oxide). Thus, the formed buried oxide layer, also referred to as the insulator layer 238, electrically separates the semiconductor layer 236 into a bottom portion as the bottom electrode layer 236 and the semiconductor layer 240. The implantation process 244a parameters (e.g., ion concentration, implantation depth, and/or implantation temperature) are configured (tuned) to control the depth of the insulator layer 238 is below the top surface of the semiconductor layer 240 for a distance t1 and the thickness of the insulator layer 238 is at t1'.

Figure 12C:
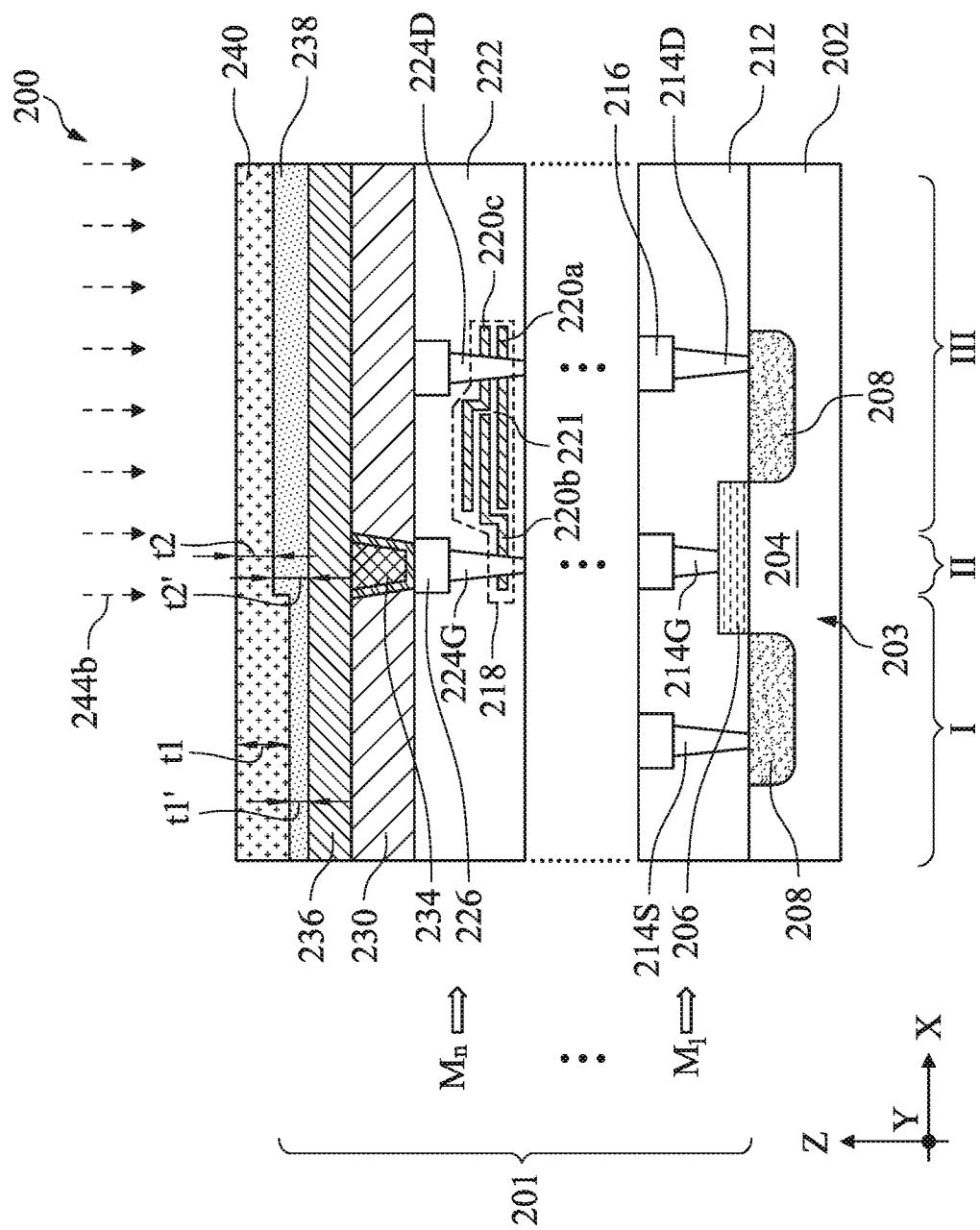

Referring to FIG. 12C, the ion-implantation of oxygen ions is limited to regions II and III, for example by an implantation mask (not shown), such that the thickness of the insulator layer 238 in the regions II and III continues to grow. The implantation process 244b parameters (e.g., ion concentration, implantation depth, and/or implantation temperature) are configured (tuned) to control the thickness of the insulator layer 238 in the regions II and III stops at the thickness t2' with a distance t2 from the top surface of the semiconductor layer 240.

Figure 12D:
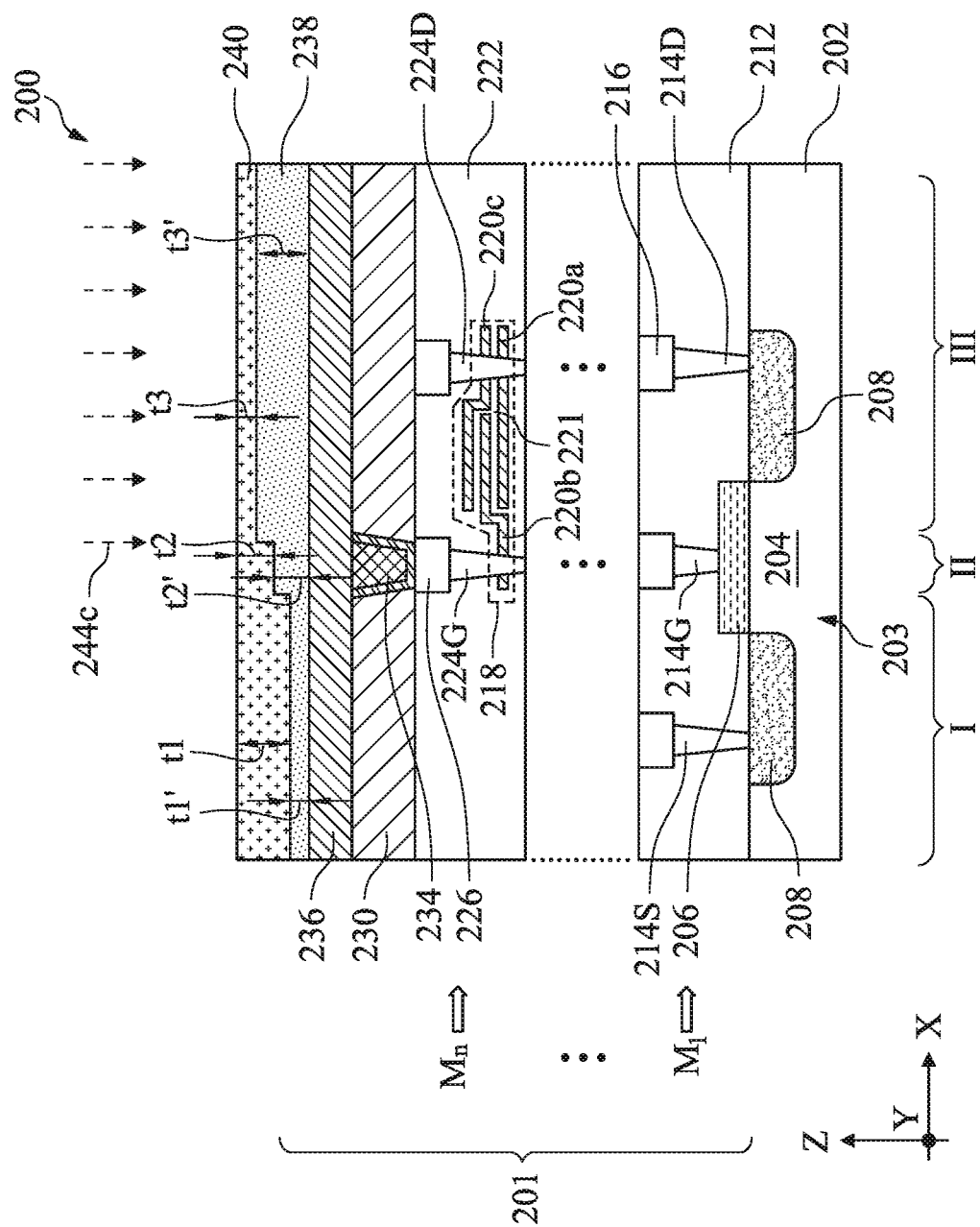

Referring to FIG. 12D, the ion-implantation of oxygen ions is limited to region III, for example by another implantation mask (not shown), such that the thickness of the insulator layer 238 in the region III continues to grow. The implantation process 244c parameters (e.g., ion concentration, implantation depth, and/or implantation temperature) are configured (tuned) to control the thickness of the insulator layer 238 in the region III stops at the thickness t3' with a distance t3 from the top surface of the semiconductor layer 240.

Figure 13:
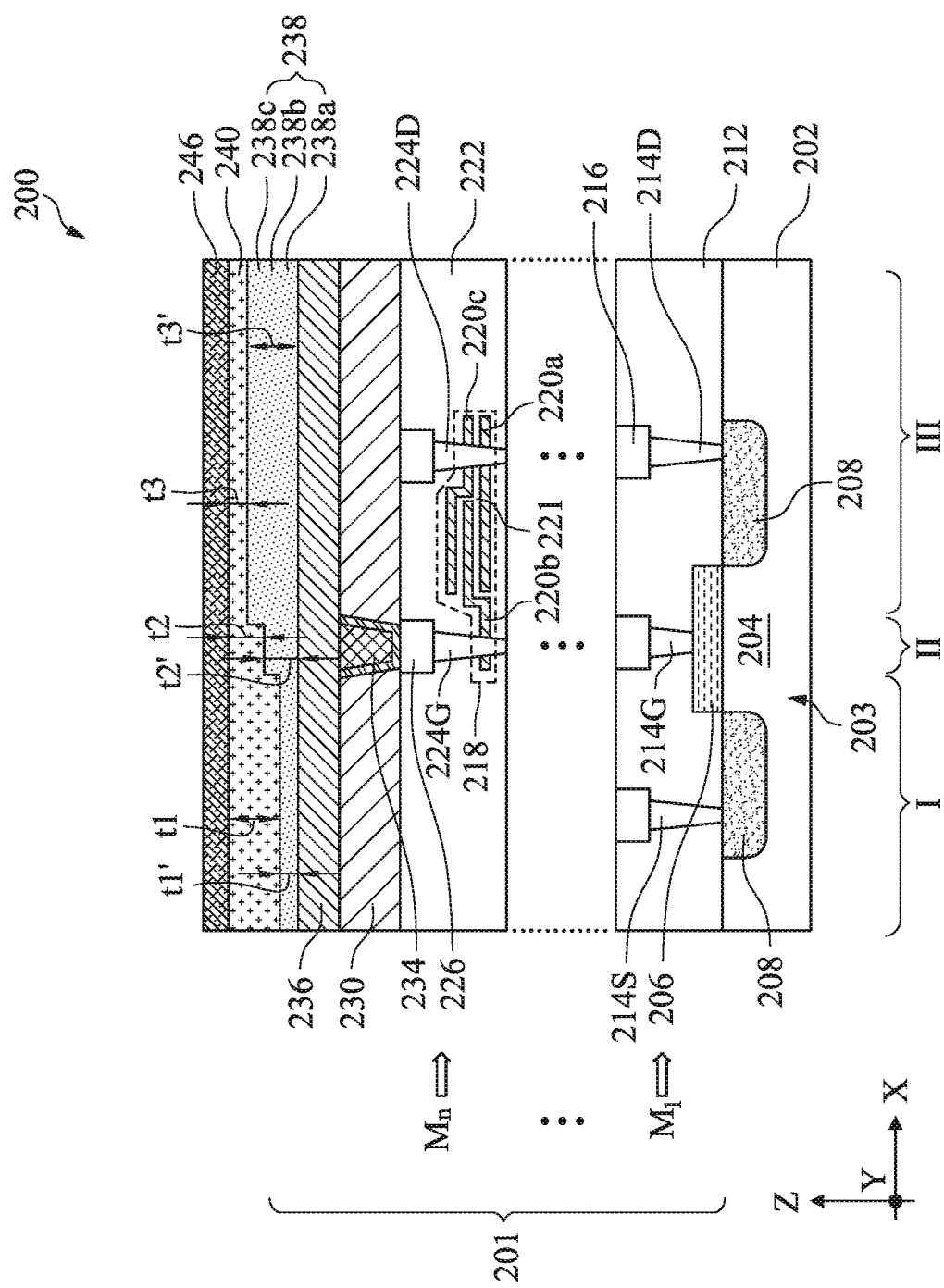

Referring to FIGS. 3 and 13, method 100 includes a block 116 where a dielectric layer 246 is deposited on the semiconductor layer 240. The material composition in the dielectric layer 246 is substantially similar to the dielectric layer 22 (FIG. 1B) discussed above. The dielectric layer 246 includes a non-polarization material. In some embodiments, the dielectric layer 246 includes a dielectric material having a dielectric constant (k) smaller than about 28 (e.g., k<28). In some embodiments, the dielectric layer 246 includes a metal oxide material. For example, the dielectric layer 246 includes $Al_xO_y$, $Si_xO_y$, $Ta_xO_y$, $Ti_xO_y$, $La_xO_y$, $Y_xO_y$, $Sr_xTiO_z$, or combinations thereof, where x, y, z are atom percentages. In one example, the dielectric layer 246 includes $Si_xN_y$. The dielectric layer 246 is deposited by CVD, PVD, ALD, FCVD, HDPCVD, MOCVD, RPCVD, PECVD, LPCVD, ALCVD, APCVD, other suitable methods, or combinations thereof. In the depicted embodiment, the dielectric layer 246 is formed by a conformal deposition process, such that the dielectric layer 246 has a substantial uniform thickness over the device 200. In some embodiments, forming the dielectric layer 246 includes depositing a dielectric material, where deposition parameters of the deposition processes (e.g., deposition precursor flow rates, deposition temperature, deposition time, and/or deposition pressure) are configured (tuned) to control the growth of the dielectric layer 246 such that a thickness of the dielectric layer 246 is less than about 2 nm.

Figure 14:
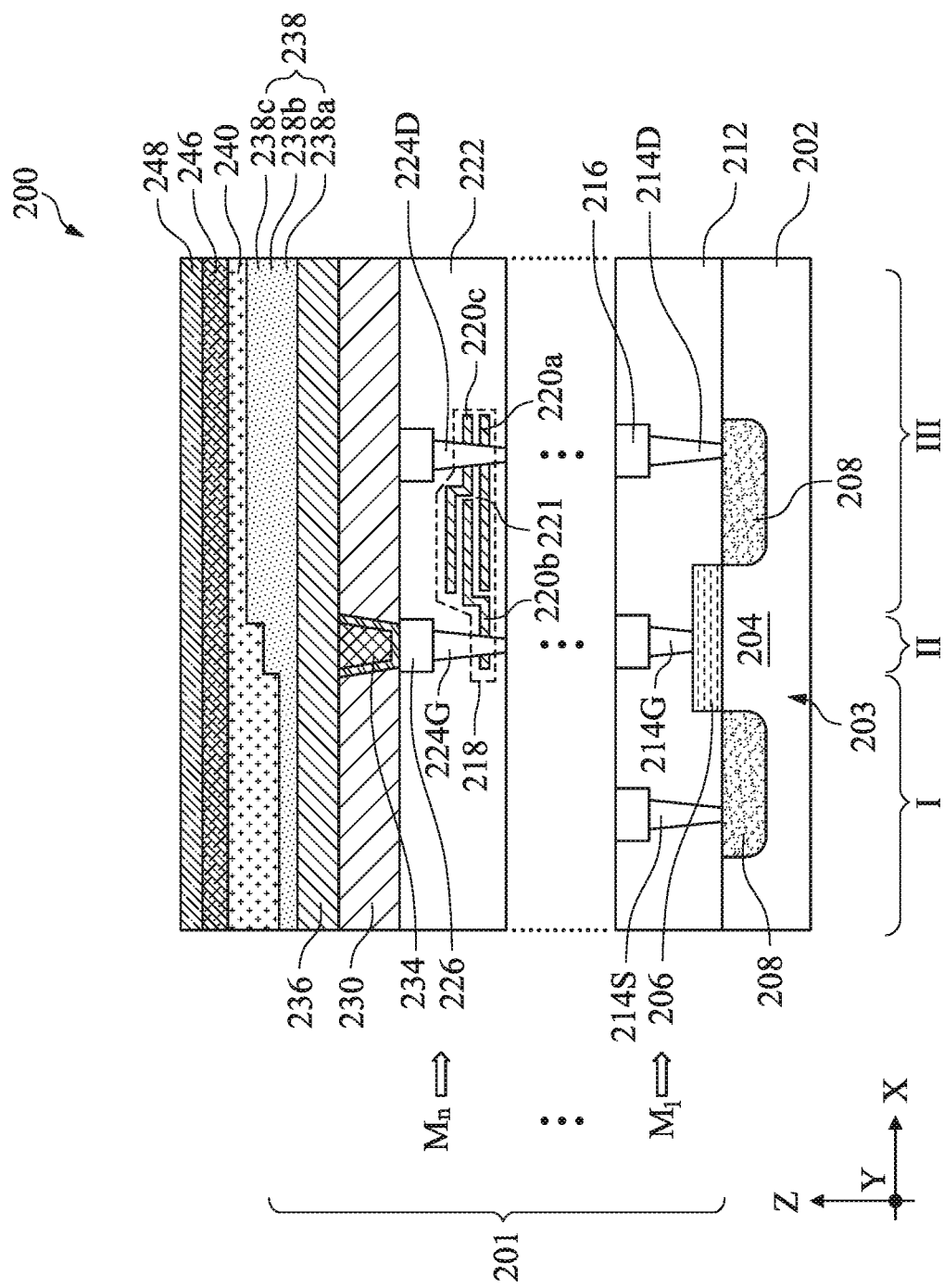

Referring to FIGS. 3 and 14, method 100 includes a block 118 where a ferroelectric layer 248 is deposited over the dielectric layer 246. The material composition in the ferroelectric layer 248 is substantially similar to the ferroelectric layer 20 (FIG. 1B) discussed above. The ferroelectric layer 248 includes a ferroelectric material, also known as a polarization material. In some embodiments, the ferroelectric layer 248 includes a metal oxide material, a metal oxynitride material, or an element doped metal oxide. For example, the ferroelectric layer 248 may include a hafnium oxide-based material or a zirconium oxide-based material. In furtherance of the example, the ferroelectric layer 248 can include hafnium oxide (e.g., $Hf_xO_y$), hafnium zirconium oxide (e.g., $Hf_xZr_zO_y$) (also referred to as HZO), hafnium aluminum oxide (e.g., $Hf_xAl_zO_y$), hafnium lanthanum oxide (e.g., $Hf_xLa_zO_y$), hafnium cerium oxide (e.g., $Hf_xCe_zO_y$), hafnium silicon oxide ($Hf_xSiO_y$), hafnium gadolinium oxide (e.g., $Hf_xGd_zO_y$), other suitable $Hf_xO_y$-based material (e.g., $Hf_xSr_zO_z$, $Hf_xY_yO_z$), or combinations thereof, where x, y, z are atom percentages. In another example, the ferroelectric layer 248 can include a $Zr_jO_k$-based material, where j, k, z are atom percentages. The ferroelectric layer 248 may be blanketly deposited by CVD, PVD, ALD, FCVD, HDPCVD, MOCVD, RPCVD, PECVD, LPCVD, ALCVD, APCVD, other suitable methods, or combinations thereof.

Figure 15:
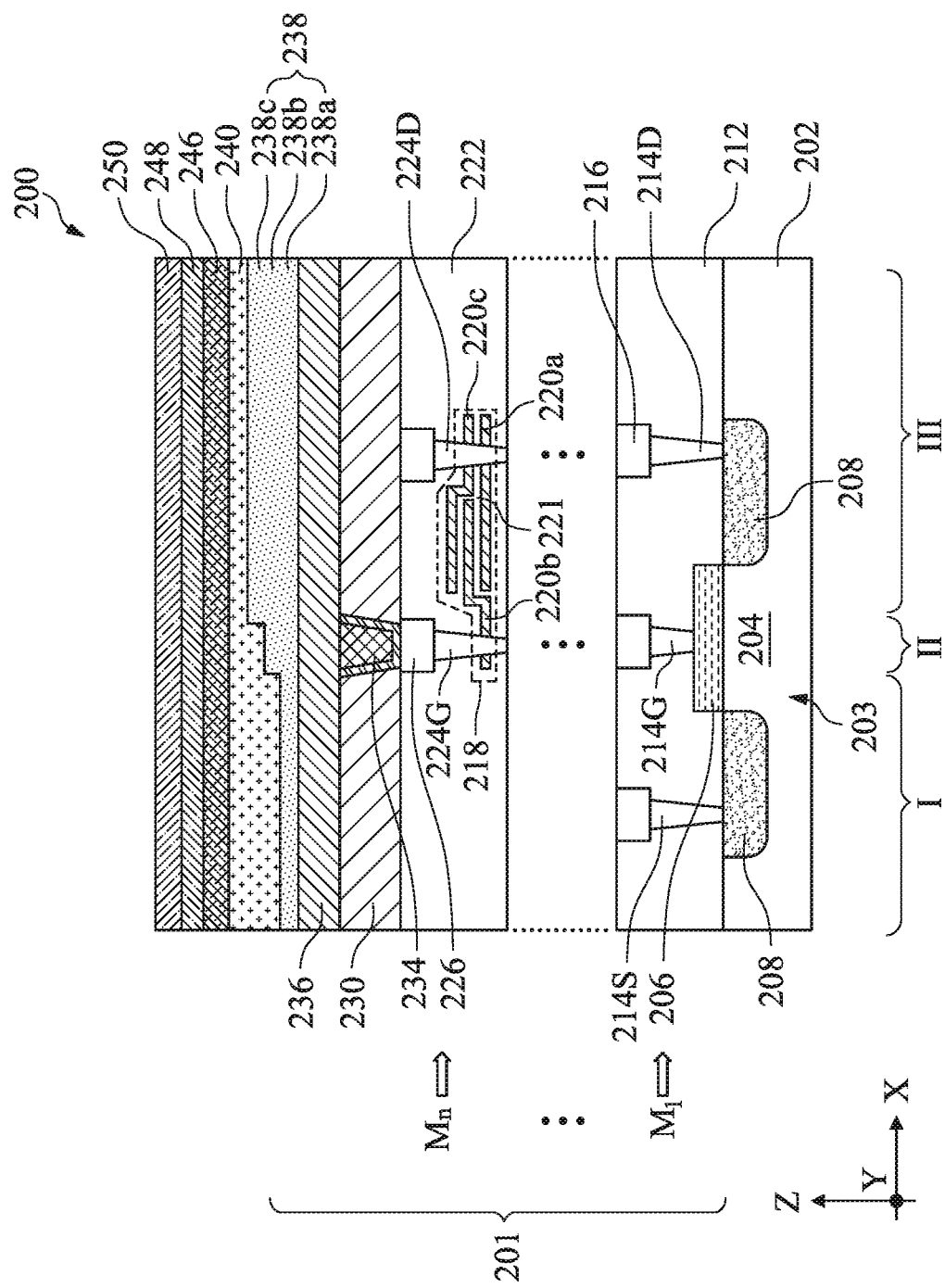

Referring to FIGS. 3 and 15, method 100 includes a block 120 where a top electrode layer 250 is deposited over the ferroelectric layer 248. The material composition in the top electrode layer 250 is substantially similar to the top electrode 18 (FIGS. 1A and 1B) discussed above. The top electrode layer 250 may be a metal layer, a metal-nitride layer, a metal-oxide layer, or a polysilicon layer. The top electrode layer 250 may be blanketly deposited by CVD, PVD, ALD, FCVD, HDPCVD, MOCVD, RPCVD, PECVD, LPCVD, ALCVD, APCVD, other suitable methods, or combinations thereof. In one example, the top electrode layer 250 may include Al, Ti, Ta, Au, Pt, W, Ni, Ir, other suitable metal, alloys thereof (e.g., TaN, TiN, and/or other suitable alloy), or combinations thereof. In another example, the top electrode 250 may include a metal oxide, such as $IrO_2$. In yet another example, the top electrode 250 may include polysilicon (n-type doped or p-type doped). In some embodiments, the bottom electrode layer 236 includes a semiconductor material and the top electrode layer 250 includes a metal layer. In some embodiments, the bottom electrode layer 236 and the top electrode layer 250 have the same material composition (e.g., the same metal material).

Figure 16:
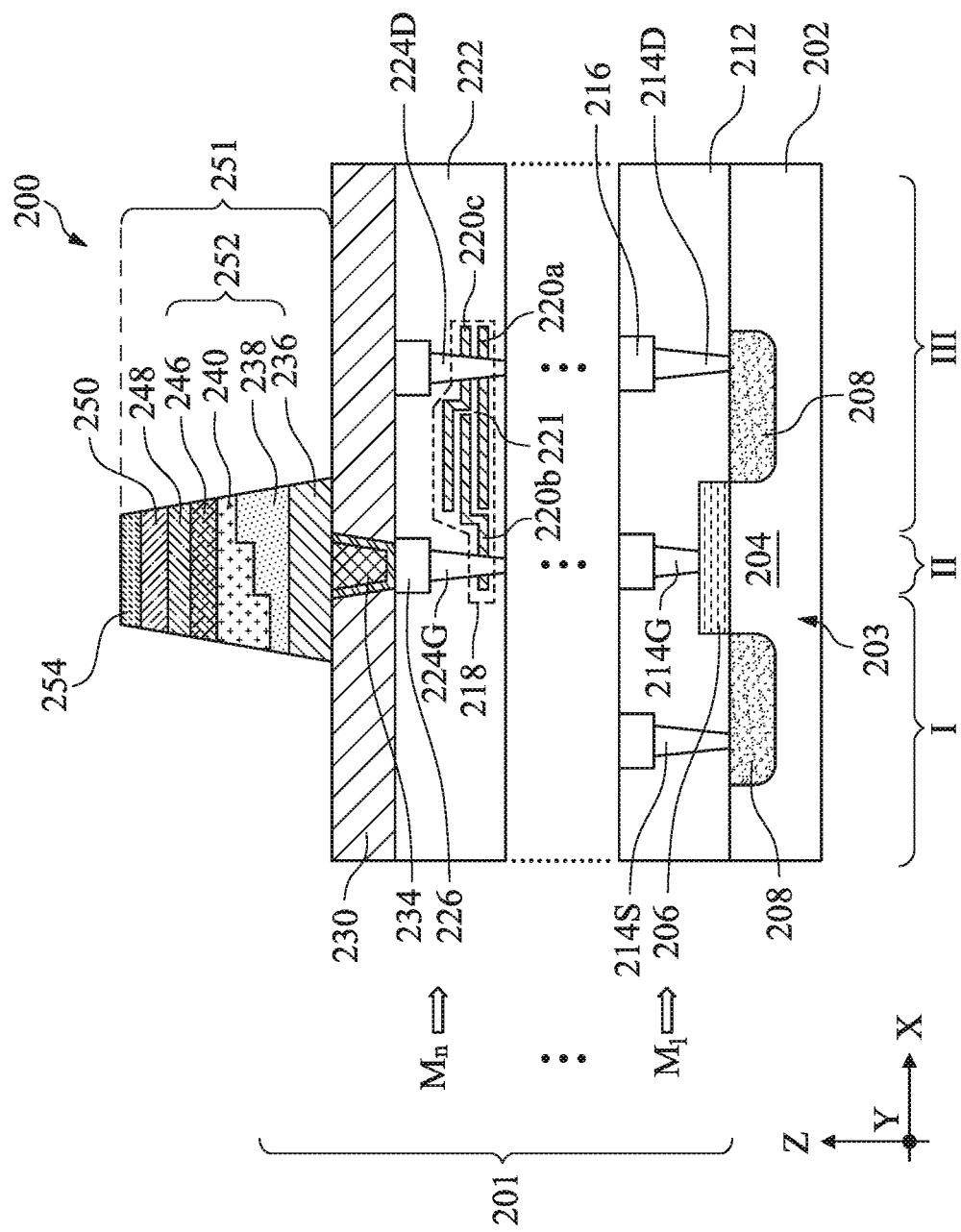

Referring to FIGS. 3 and 16, method 100 includes a block 122 where the bottom electrode layer 236, the insulator layer 238, the semiconductor layer 240, the dielectric layer 246, the ferroelectric layer 248, and the top electrode layer 250 are patterned to form a ferroelectric stack 251. The patterned insulator layer 238, semiconductor layer 240, dielectric layer 246, and ferroelectric layer 248 constitute an FSL stack 252. The FSL stack 252 is substantially similar to the FSL stack 14 (FIGS. 1A and 1B) discussed above. A combination of photolithography processes and etching processes are performed to pattern the bottom electrode layer 236, the insulator layer 238, the semiconductor layer 240, the dielectric layer 246, the ferroelectric layer 248, and the top electrode layer 250. In an example process, a hard mask layer 254 is blanketly deposited over the top electrode layer 250 using CVD. The hard mask layer 254 may include silicon oxide, silicon nitride, or silicon oxynitride. It is noted that a composition of the hard mask layer 254 is different from a composition of the ESL 230. A photoresist layer is then deposited over the hard mask layer 254 using spin-on coating. The deposited photoresist layer may undergo a pre-exposure baking process, exposure to radiation reflected from or transmitted through a photomask, a post-exposure baking process, and developing process, so as to form a patterned photoresist. The hard mask layer 254 is then etched using the patterned photoresist as an etch mask to form a patterned hard mask layer 254. The patterned hard mask layer 254 is then applied as an etch mask to etch the bottom electrode layer 236, the insulator layer 238, the semiconductor layer 240, the dielectric layer 246, the ferroelectric layer 248, and the top electrode layer 250 to form the ferroelectric stack 251. Appropriate etch process at the block 122 may be a dry etch process (e.g., a reactive ion etching (RIE) process) that includes use of an oxygen-containing gas (e.g., $O_2$), a fluorine-containing gas (e.g., $SF_6$ or $NF_3$), a chlorine-containing gas (e.g., $Cl_2$ and/or $BCl_3$), a bromine-containing gas (e.g., HBr), an iodine-containing gas, other suitable gases and/or plasmas, and/or combinations thereof.

The ferroelectric stack 251 is disposed directly over the contact via 234 such that the top surface of the contact via 234 physically couples to the bottom surface of the bottom electrode layer 236. In the depicted embodiments, the patterned hard mask layer 254 remains in the ferroelectric stack 251. In these embodiments, the patterned hard mask layer 254 is left in place because removing it may damage the top electrode 250 and it does not substantially hinder formation of any contact structure from over the ferroelectric stack 251. A portion of the insulator layer 238 and a portion of the semiconductor layer 240 in region I remain in the FSL stack 252; a portion of the insulator layer 238 and a portion of the semiconductor layer 240 in region III remain in the FSL stack 252. Inside the FSL stack 252, the portions of the insulator layer 238 and the semiconductor layer 240 with different thicknesses may have substantially the same width along the x-direction, in some embodiments. Alternatively, the portions of the insulator layer 238 and the semiconductor layer 240 with different thicknesses may have different widths along the x-direction. For example, the middle portion directly above the contact via 234 may be wider than two edge portions.

Figure 17:
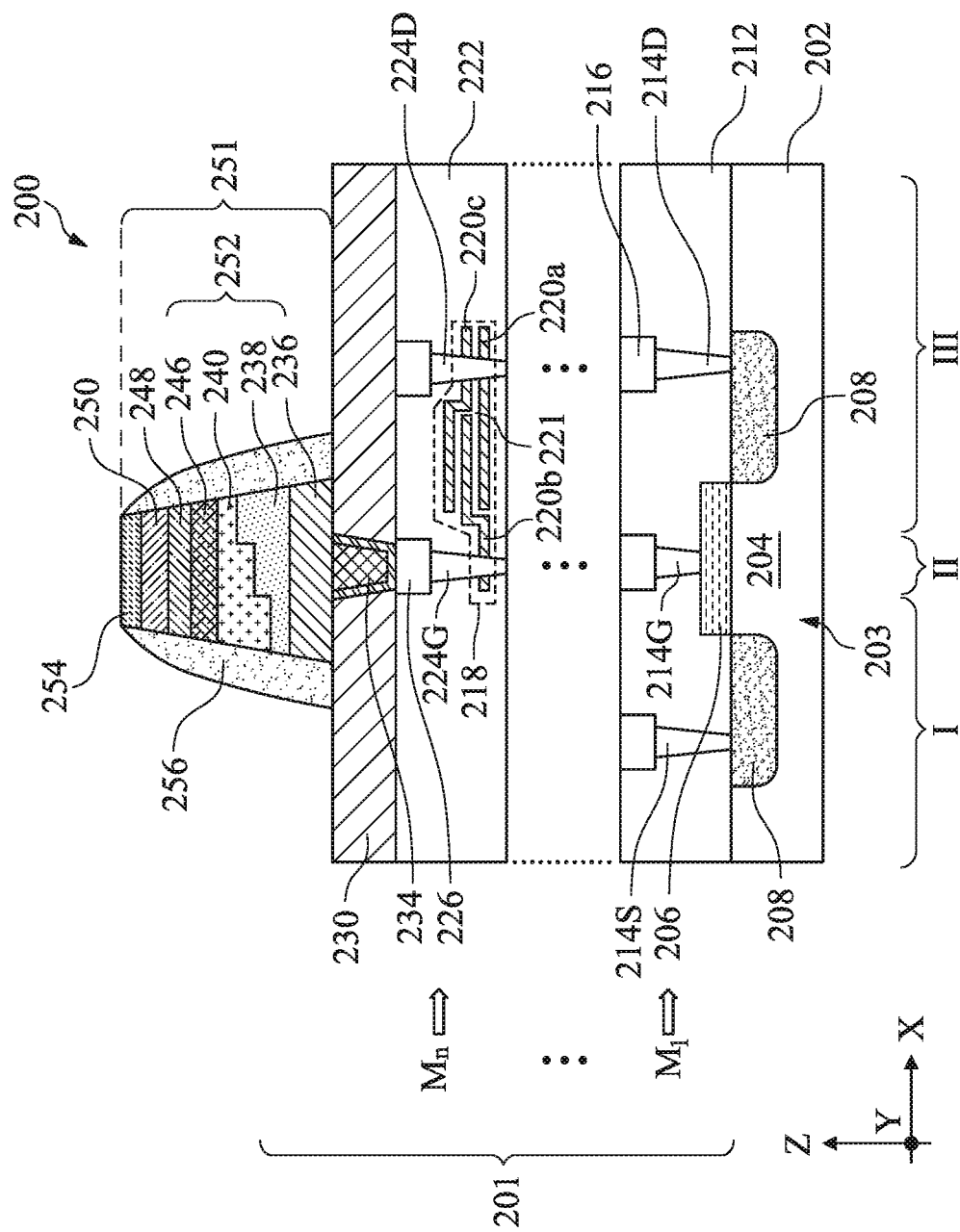
Figure 18:
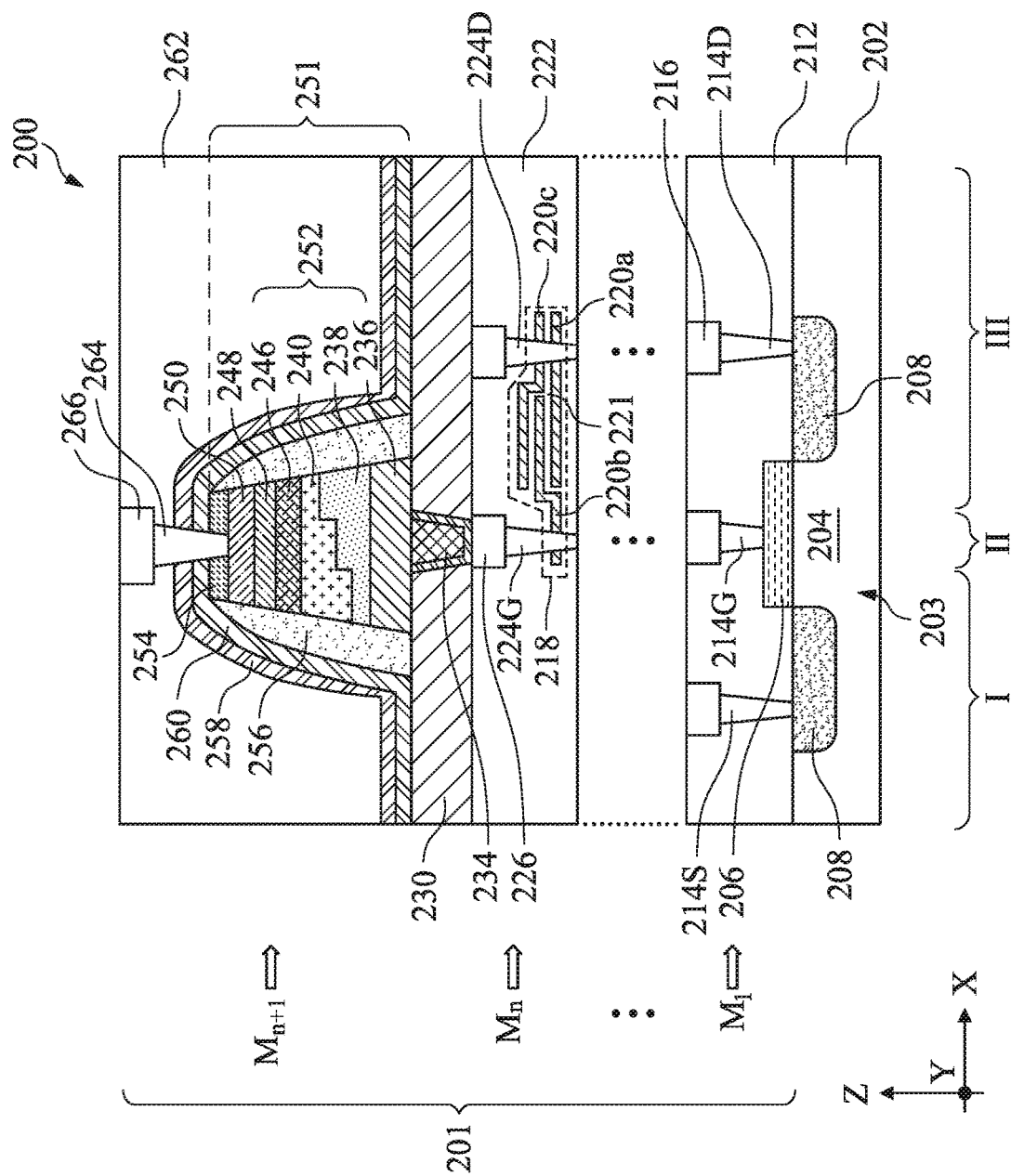

Referring to FIGS. 3, 17 and 18, method 100 includes a block 124 where further processes are performed. Such further processes at the block 124 may include formation of a spacer 256 along sidewalls of the FSL stack 252 (shown in FIG. 17), deposition of a second ESL 258 over the FSL stack 252 and the spacer 256 (shown in FIG. 18), deposition of a buffer film 260 over the second ESL 258, deposition of an $(n+1)^{th}$ IMD layer 262 over the buffer film 260 (shown in FIG. 18), and formation of an $(n+1)^{th}$ via 264 and an $(n+1)^{th}$ metal line 266 through the IMD layer 262, the buffer film 260, the second ESL 258, and the patterned hard mask layer 254 (shown in FIG. 18).

Referring to FIG. 17, the spacer 256 may be formed by conformally depositing a spacer material layer over the device 200, including over the FSL stack 252 and then anisotropically etching back the spacer material layer. As shown in FIG. 17, the spacer 256 only covers a portion of the ESL 230 and a majority of the ESL 230 is exposed after the formation of the spacer 256. In some embodiments, the spacer 256 may include silicon nitride. Then, referring to FIG. 18, the second ESL 258 is conformally deposited over the ESL 230. The second ESL 258 is formed from a different material than the ESL 230. In some implementations, the second ESL 258 includes silicon nitride. After the deposition of the second ESL 258, the buffer film 260 is conformally deposited over the second ESL 258. The buffer film 260 may, for example, include ruthenium, carbon, some other suitable material(s), or combinations thereof. This selection of material for the buffer film 260 is not trivial. Besides serving as a protective layer in additional the patterned hard mask 254, the buffer film 260 functions to exert additional stress on the FSL stack 252, especially the ferroelectric layer 248 to stabilize the ferroelectricity in the ferroelectric layer 248.

After the deposition of the buffer film 260, the $(n+1)^{th}$ IMD layer 262 is deposited over the device 200. The IMD layer 262 shares the same composition with the underneath IMD layer 222 and detailed description thereof is omitted for brevity. A dual damascene may then be performed to form the $(n+1)^{th}$ via 264 and the $(n+1)^{th}$ metal line 266 through the IMD layer 262 such that the $(n+1)^{th}$ via 264 physically couples to the top electrode 250. The $(n+1)^{th}$ via 264 and the $(n+1)^{th}$ metal line 266 may be similar to the first vias 214D/214G and the metal lines 216 in terms of compositions and detailed descriptions thereof are omitted for brevity. It is noted that each of the vias and metal line may be a continuous structure as they are formed using a dual damascene process. The line between a via and an overlying metal line is shown only to facilitate the understanding. Although not explicitly shown in the figures, further metal layers (such as $M_{n+2}$, $M_{n+3}$, and so on), may be formed over the $(n+1)^{th}$ metal layer to complete the interconnect structure 201.

In the depicted embodiment, the ferroelectric layer 248 has a thickness to allow quantum-mechanical tunneling, thus the FSL stack 252 is an FTJ stack and the device 200 is an FTJ memory device. The top metal line 266 is coupled to a bit line (BL) of the memory device. The metal line 216 disposed on the via 214S is coupled to a source line of the memory device. The metal line 226 disposed on the via 224D is coupled to a word line (WL) of the memory device. The MIM capacitor 218 is across the gate of the transistor 203 and the WL, forming a self-amplified cell current (SACC) circuitry. The FTJ cell with SACC circuitry has higher sensing current level and larger memory window, which is suitable for MLC application. The illustrated FTJ memory device is, of course, merely an example and is not intended to be limiting. As discussed above, an FSL stack that supports MLC application can be applied to FeFET memory devices, FeRAM memory devices, or FTJ memory devices.

In one exemplary aspect, the present disclosure is directed to a method. The method includes forming a bottom electrode layer over a substrate, forming an insulator layer over the bottom electrode layer, depositing a semiconductor layer over the bottom electrode layer, the semiconductor layer including a plurality of portions with different thicknesses, depositing a ferroelectric layer over the semiconductor layer, forming a top electrode layer over the ferroelectric layer, and patterning the bottom electrode layer, the insulator layer, the semiconductor layer, the ferroelectric layer, and the top electrode layer to form a memory stack. In some embodiments, the method further includes prior to the forming of the ferroelectric layer, depositing a dielectric layer over the semiconductor layer. In some embodiments, the dielectric layer includes a non-polarization material. In some embodiments, the dielectric layer and the insulator layer include a same metal oxide. In some embodiments, the forming of the insulator layer includes depositing a first dielectric layer covering the bottom electrode layer, and depositing at least a second dielectric layer partially covering the first dielectric layer. In some embodiments, the forming of the insulator layer includes depositing a dielectric layer covering the bottom electrode layer, and partially recessing a portion of the dielectric layer. In some embodiments, the forming of the insulator layer includes depositing a semiconductor-containing layer over the substrate, performing a first ion-implantation process to passivate a middle portion of the semiconductor-containing layer, thereby forming the insulator layer embedded in the semiconductor-containing layer, and performing at least a second ion-implantation process to grow a thickness of a portion of the insulator layer. In some embodiments, a bottom surface of the semiconductor layer has a step profile. In some embodiments, a top surface of the semiconductor layer is planar. In some embodiments, the thicknesses of the plurality of portions of the semiconductor layer range from about 1 nm to about 10 nm.

In another exemplary aspect, the present disclosure is directed to a method of forming a semiconductor device including a memory stack. The method includes providing a workpiece comprising a conductive feature disposed in a first dielectric layer, depositing an etch stop layer over the workpiece, forming a contact via through the etch stop layer to contact the conductive feature, depositing a bottom electrode layer over the etch stop layer and the contact via, forming a depletion region above the bottom electrode layer, the depletion region being configured to provide multiple barrier widths of the memory stack, depositing a non-polarization layer over the depletion region, depositing a polarization layer over the non-polarization layer, depositing a top electrode layer over the polarization layer, and patterning the bottom electrode layer, the depletion region, the non-polarization layer, the polarization layer, and the top electrode layer to form the memory stack. In some embodiments, the depletion region has a step-profile surface. In some embodiments, the depletion region includes a semiconductor material. In some embodiments, a difference among the multiple barrier widths is not larger than about 10 nm. In some embodiments, the workpiece includes a metal-insulator-metal capacitor, and the conductive feature is coupled to the metal-insulator-metal capacitor. In some embodiments, the method further includes forming an insulator layer stacked between the bottom electrode layer and the depletion region. In some embodiments, a top surface of the insulating layer is conjugated with a bottom surface of the depletion region.

In yet another exemplary aspect, the present disclosure is directed to a semiconductor device. The semiconductor device includes a bottom electrode disposed on a substrate, an insulator layer disposed on the bottom electrode, the insulator layer including multiple segments with different thicknesses, a semiconductor layer disposed on the insulator layer, a dielectric layer disposed on the semiconductor layer, a ferroelectric layer disposed on the dielectric layer, and a top electrode disposed on the ferroelectric layer. In some embodiments, the semiconductor layer includes multiple segments with different thicknesses. In some embodiments, the dielectric layer includes a non-polarization material, and the ferroelectric layer includes a polarization material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a conductive feature in a top portion of a substrate;
    forming a bottom electrode layer over and in physical contact with the conductive feature;
    forming an insulator layer over the bottom electrode layer;
    depositing a semiconductor layer over the bottom electrode layer, wherein the semiconductor layer includes a plurality of portions with different thicknesses;
    depositing a ferroelectric layer over the semiconductor layer;
    forming a top electrode layer over the ferroelectric layer; and
    patterning the bottom electrode layer, the insulator layer, the semiconductor layer, the ferroelectric layer, and the top electrode layer to form a memory stack.

2. The method of claim 1, further comprising:
    prior to the forming of the ferroelectric layer, depositing a dielectric layer over the semiconductor layer.

3. The method of claim 2, wherein the dielectric layer includes a non-polarization material.

4. The method of claim 2, wherein the dielectric layer and the insulator layer include a same metal oxide.

5. The method of claim 1, wherein the forming of the insulator layer includes:
    depositing a first dielectric layer covering the bottom electrode layer; and
    depositing at least a second dielectric layer partially covering the first dielectric layer.

6. The method of claim 1, wherein the forming of the insulator layer includes:
    depositing a dielectric layer covering the bottom electrode layer; and
    partially recessing a portion of the dielectric layer.

7. The method of claim 1, wherein the forming of the insulator layer includes:
    depositing a semiconductor-containing layer over the substrate;
    performing a first ion-implantation process to passivate a middle portion of the semiconductor-containing layer, thereby forming the insulator layer embedded in the semiconductor-containing layer; and
    performing at least a second ion-implantation process to grow a thickness of a portion of the insulator layer.

8. The method of claim 1, wherein a bottom surface of the semiconductor layer has a step profile.

9. The method of claim 6, wherein a top surface of the semiconductor layer is planar.

10. The method of claim 1, wherein the thicknesses of the plurality of portions of the semiconductor layer range from about 1 nm to about 10 nm.

11. A method of forming a semiconductor device including a memory stack, the method comprising:
    providing a workpiece comprising a conductive feature disposed in a first dielectric layer;
    depositing an etch stop layer over the workpiece;
    forming a contact via through the etch stop layer to contact the conductive feature;
    depositing a bottom electrode layer over the etch stop layer and the contact via;
    forming a depletion region above the bottom electrode layer, wherein the depletion region is configured to provide multiple barrier widths of the memory stack;
    depositing a non-polarization layer over the depletion region;
    depositing a polarization layer over the non-polarization layer;
    depositing a top electrode layer over the polarization layer; and
    patterning the bottom electrode layer, the depletion region, the non-polarization layer, the polarization layer, and the top electrode layer to form the memory stack.

12. The method of claim 11, wherein the depletion region has a step-profile surface.

13. The method of claim 11, wherein the depletion region includes a semiconductor material.

14. The method of claim 11, wherein a difference among the multiple barrier widths is not larger than about 10 nm.

15. The method of claim 11, wherein the workpiece includes a metal-insulator-metal capacitor, and the conductive feature is coupled to the metal-insulator-metal capacitor.

16. The method of claim 11, further comprising:
forming an insulator layer stacked between the bottom electrode layer and the depletion region.

17. The method of claim 16, wherein a top surface of the insulating layer is conjugated with a bottom surface of the depletion region.

18. A method, comprising:
forming a bottom electrode layer over a substrate;
forming an insulator layer over the bottom electrode layer, wherein the insulator layer includes a flat bottom surface and a non-flat top surface;
depositing a semiconductor layer over the insulator layer, wherein the semiconductor layer includes a non-flat bottom surface and a flat top surface;
depositing a dielectric layer over the semiconductor layer;
depositing a ferroelectric layer over the dielectric layer, wherein the dielectric layer is in physical contact with both the semiconductor layer and the ferroelectric layer;
forming a top electrode layer over the ferroelectric layer; and
patterning the bottom electrode layer, the insulator layer, the semiconductor layer, the dielectric layer, the ferroelectric layer, and the top electrode layer to form a memory stack.

19. The method of claim 18, wherein the insulator layer is in physical contact with the dielectric layer.

20. The method of claim 18, wherein the semiconductor layer includes at least three different thicknesses.

* * * * *